United States Patent
Lu

(10) Patent No.: US 11,789,572 B2
(45) Date of Patent: Oct. 17, 2023

(54) DISPLAY PANEL AND DISPLAY DEVICE

(71) Applicant: Shanghai Tianma Micro-Electronics Co., Ltd., Shanghai (CN)

(72) Inventor: Feng Lu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 12 days.

(21) Appl. No.: 17/554,439

(22) Filed: Dec. 17, 2021

(65) Prior Publication Data
US 2022/0107706 A1 Apr. 7, 2022

(30) Foreign Application Priority Data
Sep. 13, 2021 (CN) .......................... 202111068959.5

(51) Int. Cl.
*G06F 3/044* (2006.01)
*G06F 3/041* (2006.01)

(52) U.S. Cl.
CPC ........ *G06F 3/0445* (2019.05); *G06F 3/04164* (2019.05)

(58) Field of Classification Search
CPC .......................... G06F 3/0445; G06F 3/04164
USPC ........................................................ 345/173
See application file for complete search history.

(56) References Cited

U.S. PATENT DOCUMENTS

| | | | | |
|---|---|---|---|---|
| 2019/0073976 A1* | 3/2019 | Yeh | ............... | G02F 1/136286 |
| 2019/0095007 A1* | 3/2019 | Jeong | .................. | H10K 77/111 |
| 2019/0121479 A1* | 4/2019 | Lee | ...................... | G06F 3/0412 |
| 2019/0131572 A1* | 5/2019 | Gwon | .................. | G09G 3/3225 |
| 2020/0110497 A1* | 4/2020 | Jin | .................. | G06F 3/04164 |
| 2020/0210006 A1* | 7/2020 | Son | .................. | H10K 59/40 |
| 2021/0191557 A1* | 6/2021 | Jin | .................. | G06F 3/0412 |
| 2021/0192987 A1* | 6/2021 | Du | .................. | H05K 1/0218 |
| 2022/0206606 A1* | 6/2022 | Ye | .................. | G06F 3/0443 |

FOREIGN PATENT DOCUMENTS

CN 109728041 A 5/2019

\* cited by examiner

*Primary Examiner* — Mark Edwards
(74) *Attorney, Agent, or Firm* — CHRISTENSEN O'CONNOR JOHNSON KINDNESS PLLC

(57) ABSTRACT

A display panel and a display device are provided. The line arranging region includes a first line arranging region, a second line arranging region, and a third line arranging region. The touch lines include a first touch line located in the first line arranging region, a second touch line located in the second line arranging region, and a third touch line located in the third line arranging region. The first touch line is located in a touch layer, and the second touch line and the third touch line are located in a display layer. The power supply voltage lines include a first power supply voltage line. The third touch line is disposed in a layer different from the first power supply voltage line. The third touch line at least partially overlaps with the first power supply voltage line along a direction perpendicular to a plane of the display panel.

20 Claims, 12 Drawing Sheets

DISPLAY PANEL AND DISPLAY DEVICE

CROSS-REFERENCE TO RELATED APPLICATIONS

The present application claims priority to Chinese Patent Application No. 202111068959.5, filed on Sep. 13, 2021, the content of which is incorporated herein by reference in its entirety.

TECHNICAL FIELD

The present disclosure relates to the field of display technology, in particular to a display panel and a display device.

BACKGROUND

With continuous development of science and technology, more and more display devices are widely used in people's daily life and work, and become indispensable tools for people today. Moreover, with continuous development of display technology, consumers' requirements for displays continue to increase, and various displays are emerging, such as the liquid crystal display, the organic light-emitting display and other display technologies. On this basis, technologies such as 3D display, touch display, curved display, and ultra-high resolution display are emerging.

For touch display panels, in related technologies, a large number of touch lines for transmitting touch signals are provided in the non-display region of the display panel, resulting in a larger area of the non-display region of the display panel.

SUMMARY

In a first aspect of the present disclosure, a display panel is provided. The display panel has a display region and a non-display region, the non-display region includes a line arranging region and a binding region, and the display panel includes: touch electrodes located in the display region and in a touch layer; pixel units located in the display region and in a display layer; power supply voltage signal lines located in the display region; touch lines located in the line arranging region; power supply voltage lines located in the line arranging region and electrically connected to the power supply voltage signal lines; and touch bonding pads located in the binding region and electrically connected to the touch electrodes through the touch lines. The touch layer is located on a side of the display layer facing away from a substrate, the line arranging region includes a first line arranging region, a second line arranging region, and a third line arranging region, the second line arranging region is located between the first line arranging region and the third line arranging region, and the first line arranging region is located at a side of the second line arranging region close to the display region. The touch lines include a first touch line located in the first line arranging region, at least one second touch line located in the second line arranging region, and at least one third touch line located in the third line arranging region, the first touch line is located in the touch layer, and the at least one second touch line and the at least one third touch line are located in the display layer. The power supply voltage lines include at least one first power supply voltage line, the at least one third touch line is disposed in a layer different from a layer where the at least one first power supply voltage line is disposed, and one of the at least one third touch line at least partially overlaps with one of the at least one first power supply voltage line along a direction perpendicular to a plane of the display panel.

In a second aspect of the present disclosure, a display device is provided. The display device includes a display panel, and the display panel has a display region and a non-display region, the non-display region includes a line arranging region and a binding region, and the display panel includes: touch electrodes located in the display region and in a touch layer; pixel units located in the display region and in a display layer; power supply voltage signal lines located in the display region; touch lines located in the line arranging region; power supply voltage lines located in the line arranging region and electrically connected to the power supply voltage signal lines; and touch bonding pads located in the binding region and electrically connected to the touch electrodes through the touch lines. The touch layer is located on a side of the display layer facing away from a substrate, the line arranging region includes a first line arranging region, a second line arranging region, and a third line arranging region, the second line arranging region is located between the first line arranging region and the third line arranging region, and the first line arranging region is located at a side of the second line arranging region close to the display region. The touch lines include a first touch line located in the first line arranging region, at least one second touch line located in the second line arranging region, and at least one third touch line located in the third line arranging region, the first touch line is located in the touch layer, and the at least one second touch line and the at least one third touch line are located in the display layer. The power supply voltage lines include at least one first power supply voltage line, the at least one third touch line is disposed in a layer different from a layer where the at least one first power supply voltage line is disposed, and one of the at least one third touch line at least partially overlaps with one of the at least one first power supply voltage line along a direction perpendicular to a plane of the display panel.

BRIEF DESCRIPTION OF DRAWINGS

In order to more clearly explain the embodiments of the present disclosure, the drawings used in the description of the embodiments or the related art will be briefly described below. The drawings in the following description are some embodiments of the present disclosure. Those skilled in the art can obtain other drawings based on these drawings.

DESCRIPTION OF EMBODIMENTS

In order to better illustrate the technical solutions of the present disclosure, embodiments of the present disclosure will be described in detail below with reference to the accompanying drawings.

It should be noted that the described embodiments are only some of the embodiments of the present disclosure, rather than all of the embodiments. Based on the embodiments of the present disclosure, all other embodiments obtained by those of ordinary skill in the art shall fall within the protection scope of the present disclosure.

The terms used in the embodiments of the present disclosure are merely for the purpose of describing specific embodiment, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there can be three relations, e.g., A and/or B can indicate A alone, both A and B, and B alone. In addition, the symbol "/" in the context generally indicates that the relation between the objects in front and at the back of "/" is an "or" relationship.

It should be understood that although the terms "first" and "second" can be used in the embodiments of the present disclosure to describe touch lines, these touch lines should not be limited to these terms. These terms are only used to distinguished touch lines from each other. For example, without departing from the scope of the embodiment of the present disclosure, the first touch line can also be referred to as the second touch line, and similarly, the second touch line can also be referred to as the first touch line.

Figure 1:
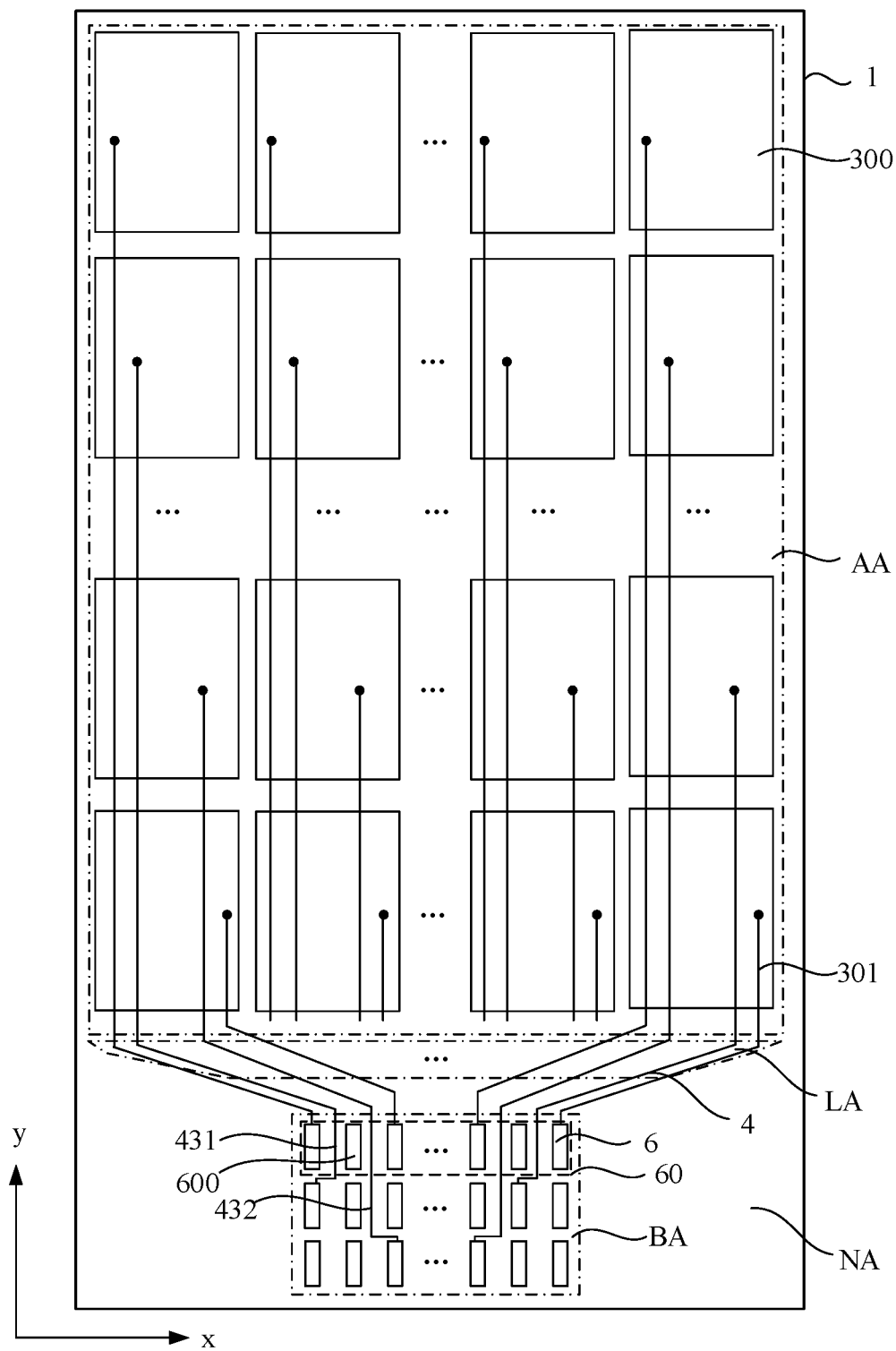
FIG. 1 is a top view of a display panel provided by an embodiment of the present disclosure.
Figure 2:
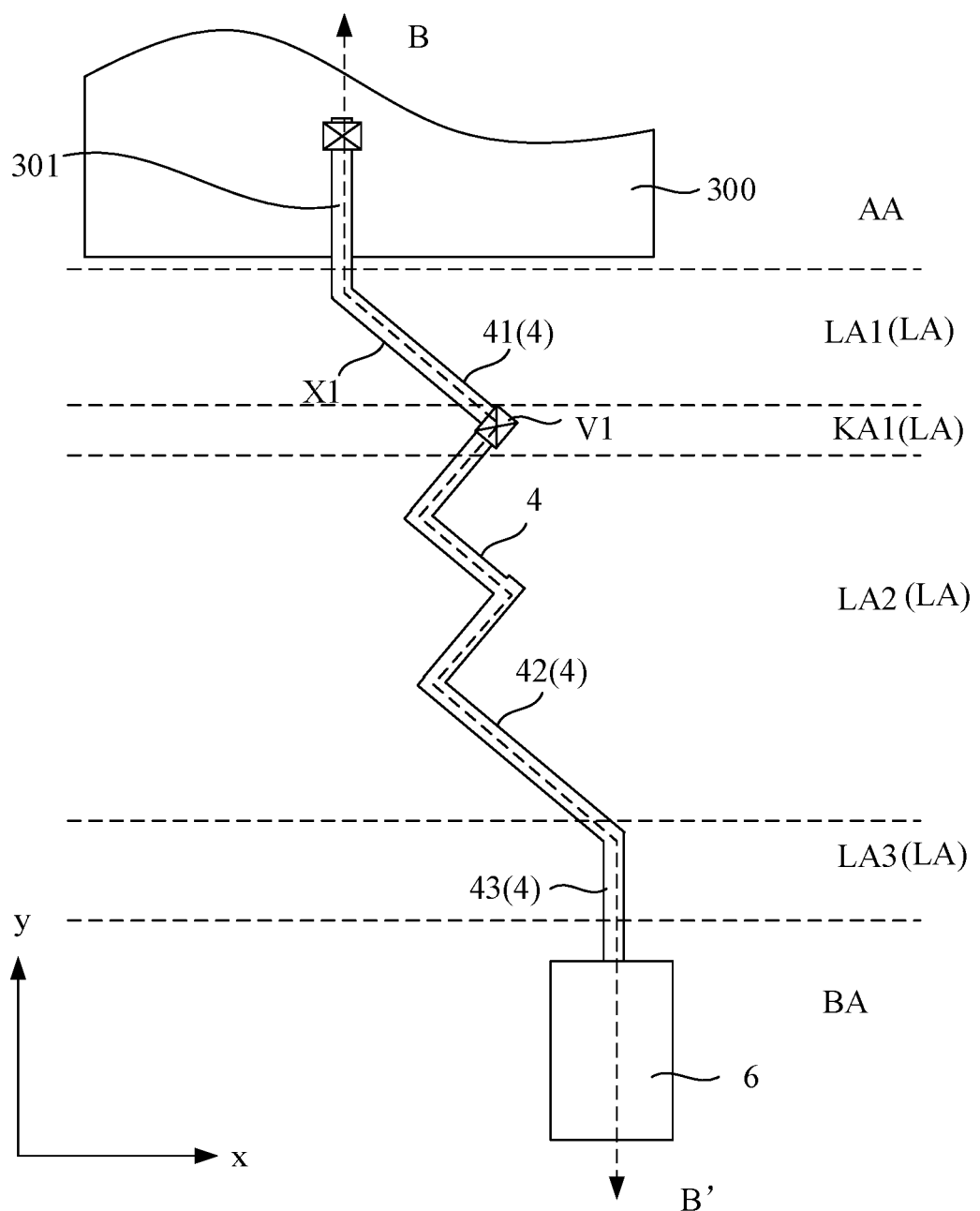
FIG. 2 is a top view illustrating interconnections between a touch electrode, a touch signal line, a touch line, and a touch bonding pad provided by an embodiment of the present disclosure.
Figure 3:
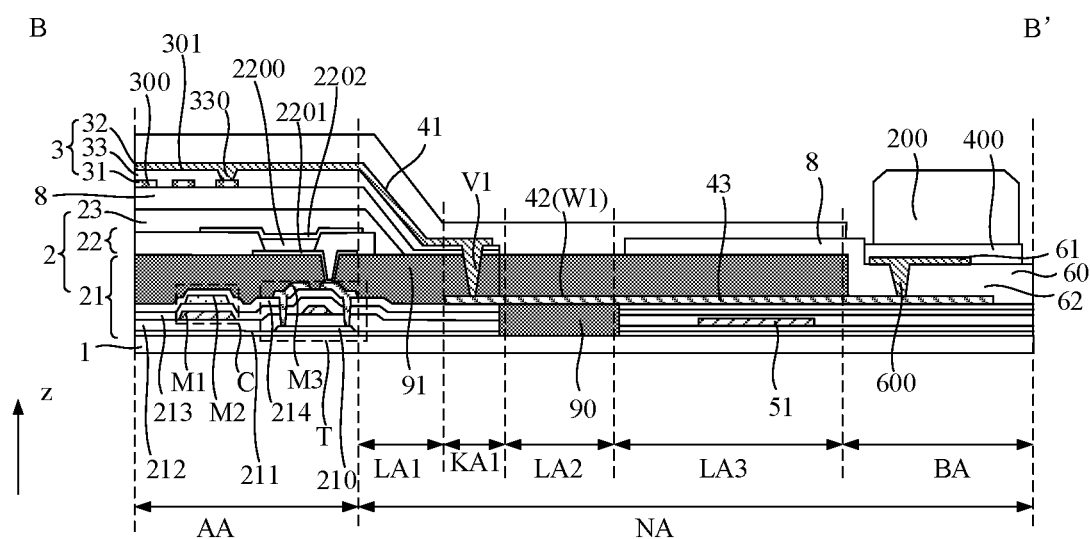
FIG. 3 is a cross-sectional view along BB' shown in FIG. 2.
Figure 4:
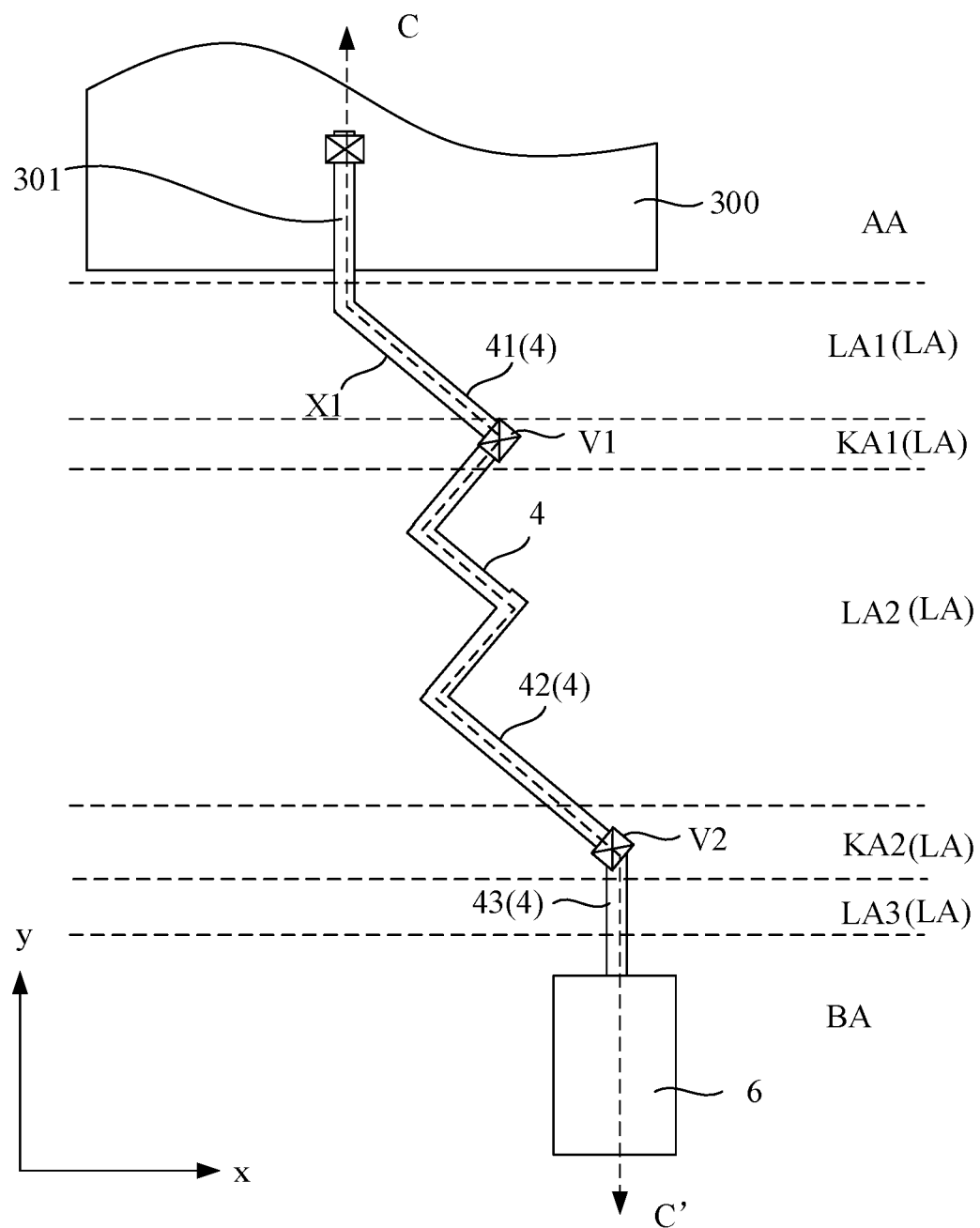
FIG. 4 is a top view illustrating interconnections between a touch electrode, a touch signal line, a touch line, and a touch bonding pad provided by another embodiment of the present disclosure.
Figure 5:
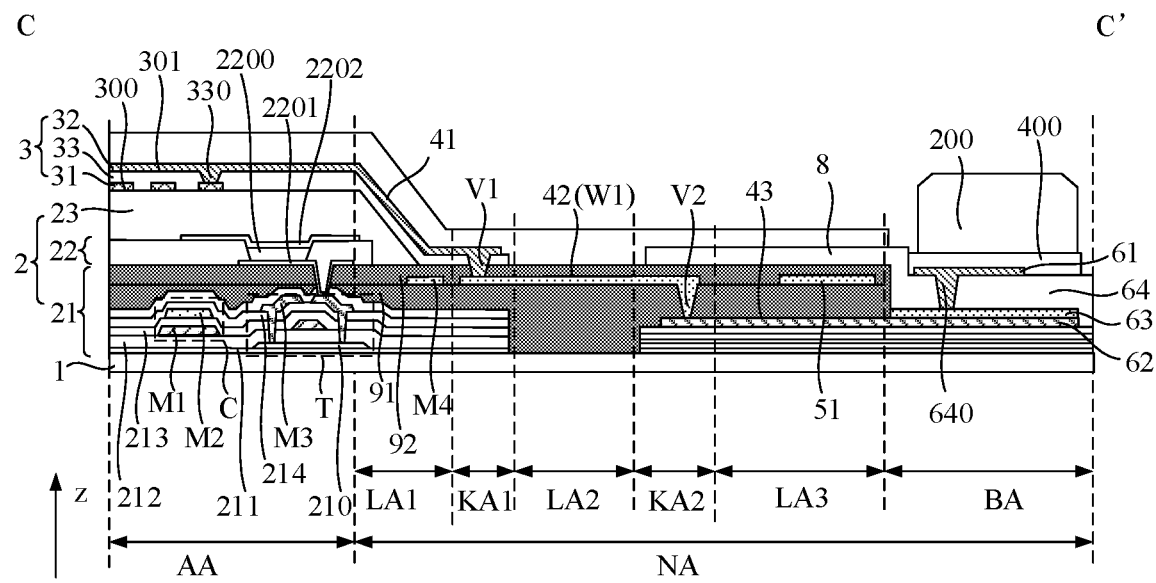
FIG. 5 is a cross-sectional view along CC' shown in FIG. 4.

FIG. 1 is a top view of a display panel provided by an embodiment of the present disclosure. FIG. 2 is a top view illustrating interconnections between a touch electrode, a touch signal line, a touch line, and a touch bonding pad provided by an embodiment of the present disclosure. FIG. 3 is a cross-sectional view along BB' shown in FIG. 2. FIG. 4 is a top view illustrating interconnections between a touch electrode, a touch signal line, a touch line, and a touch bonding pad provided by another embodiment of the present disclosure. FIG. 5 is a cross-sectional view along CC' shown in FIG. 4. An embodiment of the present disclosure provides a display panel. As shown in FIG. 1, FIG. 2, FIG. 3, FIG. 4, and FIG. 5, a display panel is provided, and the display panel includes a substrate 1, a display layer 2, and a touch layer 3. The touch layer 3 is located on a side of the display layer 2 facing away from the substrate 1. The display layer 2 is provided with pixel units and configured to display images. The touch layer 3 is provided with touch electrodes and configured to realize touch operation.

The pixel unit includes a plurality of sub-pixels emitting light of different colors. The sub-pixel includes a light-emitting unit and a pixel driving circuit that are electrically connected to each other. As shown in FIG. 3 and FIG. 5, the display layer 2 can include a driving component layer 21 and a light-emitting layer 22. The light-emitting layer 22 is located on a side of the driving component layer 21 facing away from the substrate 1. A plurality of light-emitting units are formed in the light-emitting layer 22. The light-emitting unit includes a first electrode 2201, a light-emitting material layer 2200, and a second electrode 2202. Along a direction z perpendicular to a plane of the display panel, the light-emitting material layer 2200 is located between the first electrode 2201 and the second electrode 2202. In an embodiment, a region where the light-emitting unit is provided in the display panel is defined as a display region AA of the display panel, and a region where the light-emitting unit is not provided is defined as a non-display region NA of the display panel.

A pixel driving circuit, a peripheral circuit, and various signal lines including a display signal line are formed in the driving component layer 21. The display signal line is electrically connected to the pixel driving circuit. The pixel driving circuit is electrically connected to the light-emitting unit 220. Each of the pixel driving circuit and the peripheral circuit includes a thin film transistor T. FIG. 3 and FIG. 5 illustrate only one thin film transistor T electrically connected to the light-emitting unit in the pixel driving circuit. Exemplarily, the pixel driving circuit and display signal line can be located in the display region AA. The peripheral circuit can be located in the non-display region NA.

In an embodiment of the present disclosure, the driving component layer 21 includes multiple metal layers used to form various different structures. For example, according to different design requirements, in an embodiment of the present disclosure, the driving component layer 21 includes at least three metal layers.

As shown in FIG. 3, the driving component layer 21 includes a first metal layer M1, a second metal layer M2, and a third metal layer M3 that are located on a same side of the substrate 1. The second metal layer M2 is located between the first metal layer M1 and the third metal layers M3, and the third metal layer M3 is located on a side of the second metal layer M2 facing away from the substrate 1.

As shown in FIG. 5, besides the first metal layer M1, second metal layer M2, and third metal layer M3 that are shown in FIG. 3, the driving component layer 21 can further include a fourth metal layer M4.

In the embodiment of the present disclosure, the first metal layer M1 and the second metal layer M2 are made of a material including molybdenum, and the third metal layer M3 and the fourth metal layer M4 are made of a material including, for example, aluminum.

The display signal line may include a data voltage signal line, a power supply voltage signal line, and a scanning signal line electrically connected to the pixel driving circuit. Exemplarily, the first metal layer M1 can be used to form a gate of the thin film transistor T and the scan signal line. The third metal layer M3 can be used to form a source and a drain of the thin film transistor, a data signal line, and the power voltage signal line. In an embodiment of the present disclosure, the pixel driving circuit further includes a storage capacitor C. Two of the first metal layer M1, the second metal layer M2, and the third metal layer M3 can be used to form two electrodes of the storage capacitor C, respectively. FIG. 3 and FIG. 5 are schematic diagrams showing that the first metal layer M1 and the second metal layer M2 form two electrode plates of the storage capacitor C, respectively.

In an embodiment of the present disclosure, as shown in FIG. 3, the display layer 2 further includes a semiconductor layer 210 for forming a channel of the thin film transistor T. A first insulating layer 211 is provided between the semiconductor layer 210 and the substrate 1. A second insulating layer 212 is provided between the semiconductor layer 210 and the first metal layer M1. A third insulating layer 213 is provided between the first metal layer M1 and the second metal layer M2. A fourth insulating layer 214 is provided between the second metal layer M2 and the third metal layer M3.

Exemplarily, the first insulating layer 211, the second insulating layer 212, the third insulating layer 213, and the fourth insulating layer 214 can be inorganic insulating layers.

As shown in FIG. 3 and FIG. 5, a first organic layer 91 is provided on a side of the third metal layer M3 facing away from the substrate 1. As shown in FIG. 5, a second organic layer 92 is provided on a side of the fourth metal layer M4 facing away from the substrate 1. The first organic layer 91 and the second organic layer 92 each serve as a planarization layer, which can provide a flat surface to facilitate subsequent formation of the light-emitting unit 220.

In an embodiment, as shown in FIG. 3 and FIG. 5, the display layer 2 further includes an encapsulation layer 23 located on a side of the light-emitting layer 22 facing away from the driving component layer 21. Exemplarily, the encapsulation layer 23 can be formed as a thin-film encapsulation structure in which an inorganic encapsulation layer and an organic encapsulation layer are stacked.

As shown in FIG. 1, FIG. 2, FIG. 3, FIG. 4, and FIG. 5, touch electrodes 300 and touch signal lines 301 are formed in the touch layer 3. The touch electrode 300 and the touch signal line 301 are located in the display region AA. In an embodiment of the present disclosure, the touch layer 3 can include a first touch conductive layer 31 and a second touch conductive layer 32. One of the first touch conductive layer 31 and the second touch conductive layer 32 can be used to form the touch electrodes 300, and the other one of the first touch conductive layer 31 and the second touch conductive layer 32 can be used to form the touch signal lines 301. As shown in FIG. 3 and FIG. 5, the touch electrode 300 is located in the first touch conductive layer 31, and the touch signal line 301 is located in the second touch conductive layer 32. The touch electrode 300 and the touch signals line 301 are electrically connected to each other through a via 330 formed in the touch insulating layer 33. In an embodiment of the present disclosure, the touch electrode 300 can be located in the second touch conductive layer 32, and the touch signal line 301 can be located in the first touch conductive layer 31, which will not be limited in the embodiments of the present disclosure.

In an embodiment, as shown in FIG. 1, the display panel can adopt a self-capacitive touch technology, and a plurality of touch electrodes 300 is arranged in an array in the display panel. The touch electrodes 300 can at least partially overlap with the light-emitting units (not shown in FIG. 1) in the direction perpendicular to the plane of the display panel. Exemplarily, in an embodiment of the present disclosure, a plurality of openings can be formed in the touch electrodes 300, and the openings and the light-emitting units can overlap with each other in the direction perpendicular to the plane of the display panel. The touch electrode 300 can be made of a material including metal. Such configuration can reduce a resistance of the touch electrodes 300 and increase a transmission rate of the touch signal, while preventing the touch electrodes 300 from affecting light output of the light-emitting units and improving a display effect of the display panel.

As shown in FIG. 3, a buffer layer 8 can be provided between the light-emitting layer 22 and the display layer 2. With the buffer layer 8, when the touch electrode 300 and/or the touch signal line 301 are formed by etching, if over-etching occurs, the structure in the display layer 2 will not be affected. Exemplarily, the buffer layer 8 can be made of an inorganic material.

In an embodiment, as shown in FIG. 5, in the display region AA, at least part of the encapsulation layer 23 can be reused as the buffer layer. For example, when the encapsulation layer 23 is formed as a thin-film encapsulation structure including an inorganic encapsulation layer and an organic encapsulation layer that are stacked, the inorganic encapsulation layer on a side of the thin-film encapsulation structure facing the touch layer 3 can be reused as the buffer layer.

As shown in FIG. 1, FIG. 2, FIG. 3, FIG. 4, and FIG. 5, the non-display region NA includes a binding region BA and a line arranging region LA. Exemplarily, the binding region BA and the line arranging region LA are arranged along the second direction y. The binding region BA is located at a side of the line arranging region LA away from the display region AA.

A plurality of bonding pads is provided in the binding region BA and includes display bonding pads and touch bonding pads 6. The display bonding pads include a power supply signal bonding pad and a data bonding pad.

Lines that transmit various signals are provided in the line arranging region LA. For example, the lines include display lines and touch lines 4. The display lines include a power supply voltage line and a data line. The power supply bonding pad is electrically connected to the power supply voltage signal line through the power supply voltage line. The data bonding pad is electrically connected to the data voltage signal line through the data line. The touch bonding pad 6 is electrically connected to the corresponding touch electrode 300 through the touch line 4.

After the various layers in the display panel are manufactured, the display bonding pad and the display chip can be bound and connected to each other, and the touch bonding pad 6 and the touch chip can be bound and connected to each other. When the display panel displays images, the display chip provides various display signals to the pixel driving circuit through display signal lines. When driven by the various display signals, the pixel driving circuit drives the light-emitting unit to light up for display. When a touch operation is performed on the display panel, a capacitance will be generated between a finger and the touch electrode 300 when the finger touches the display panel, and this capacitance will be superimposed on a capacitance between the touch electrode 300 and the ground, thereby changing the capacitance between the touch electrode 300 and the ground, and a change value of the capacitance between the touch electrode 300 and the ground can be transmitted to the touch chip through the touch signal line 301 electrically connected to the touch electrode 300. Then the touch chip can determine a touch position according to the change value of the capacitance generated before and after the touch.

In an embodiment of the present disclosure, as shown in FIG. 3 and FIG. 5, the touch chip and display chip can be integrated and designed into a single integrated chip 200, that is, using touch and display driver integration (TDDI) technology.

In an embodiment of the present disclosure, as shown in FIG. 2, FIG. 3, FIG. 4, and FIG. 5, the line arranging region LA includes a first line arranging region LA1, a second line arranging region LA2, and a third line arranging region LA3. Exemplarily, the first line arranging region LA1, the second line arranging region LA2, and the third line arranging region LA3 are arranged along a second direction y. The second line arranging region LA2 is located between the first line arranging region LA1 and the third line arranging region LA3. The first line arranging region LA1 is located at a side of the second line arranging region LA2 close to the display region AA.

The touch line 4 includes a first touch line 41 located in the first line arranging region LA1, a second touch line 42 located in the second line arranging region LA2, and a third touch line 43 located in the third line arranging region LA3. The second touch line 42 connects the first touch line 41 with the third touch line 43. The first touch line 41, the second touch line 42 and the third touch line 43 can extend in a same direction or extend in different directions. Each of the first touch line 41, the second touch line 42, and the third touch line 43 may be a line extending in a single direction, or may be a polyline including multiple line segments that extend in different directions.

In an embodiment, the first touch line 41 is adjacent and connected to the touch signal line 301 located in the display region AA. The third touch line 43 is adjacent and connected to the touch bonding pad 6 located in the binding region BA.

In an embodiment of the present disclosure, as shown in FIG. 3 and FIG. 5, the first touch line 41 is located in the touch layer 3. That is, the first touch line 41 is formed by at least a part of a layer of the touch layer 3.

Exemplarily, when the first line arranging region LA1 and the display region AA are adjacent to each other, and the first touch line 41 can be arranged in a same layer as the touch signal line 301 located in the display region AA, that is, the first touch line 41 can be formed by the touch signal line 301 located in the display region by directly extending to the first line arranging region LA1. There is no need to change lines between the touch signal line 301 and the first touch line 41.

Both the second touch line 42 and the third touch line 43 are located in the display layer 2. That is, each of the second touch line 42 and the third touch line 43 is formed by at least a part of a layer of the display layer 2.

Exemplarily, the second touch line 42 and the third touch line 43 can be formed by a same layer of the display layer 2. As shown in FIG. 3, both the second touch line 42 and the third touch line 43 may be located in the third metal layer M3.

In an embodiment, the second touch line 42 and the third touch line 43 can also be formed by different layers of the display layer 2. As shown in FIG. 5, the second touch line 42 can be located in the fourth metal layer M4, and the third touch line 43 can be located in the third metal layer M3.

Exemplarily, as shown in FIG. 2, FIG. 3, FIG. 4, and FIG. 5, the line arranging region LA further includes a first line-changing hole region KA1 located between the first line arranging region LA1 and the second line arranging region LA2. A first line-changing hole V1 is formed in the first line-changing hole region KA1, and the first touch line 41 and the second touch line 42 are connected to each other through the first line-changing hole V1. The first line-changing hole V1 is formed in an insulating layer located between the first touch line 41 and the second touch line 42. The insulating layer includes one or more insulating sub-layers. In FIG. 3, the insulating layer located between the first touch line 41 and the second touch line 42 includes a touch insulating layer 33 and a first organic layer 91. In FIG. 5, the insulating layer located between the first touch line 41 and the second touch line 42 includes a touch insulating layer 33 and a second organic layer 92.

As shown in FIG. 3 and FIG. 5, the encapsulation layer 23 extends from the display region AA to the first line arranging region LA1. In the first line arranging region LA1, the encapsulation layer 23 has a thickness gradually reducing along a direction from the display region AA to the first line arranging region LA1. In an embodiment of the present disclosure, the first line-changing hole V1 is arranged to be away from the encapsulation layer 23 to reduce a depth and an opening area of the first line-changing hole V1, thereby reducing an area of the line arranging region LA.

Figure 6:
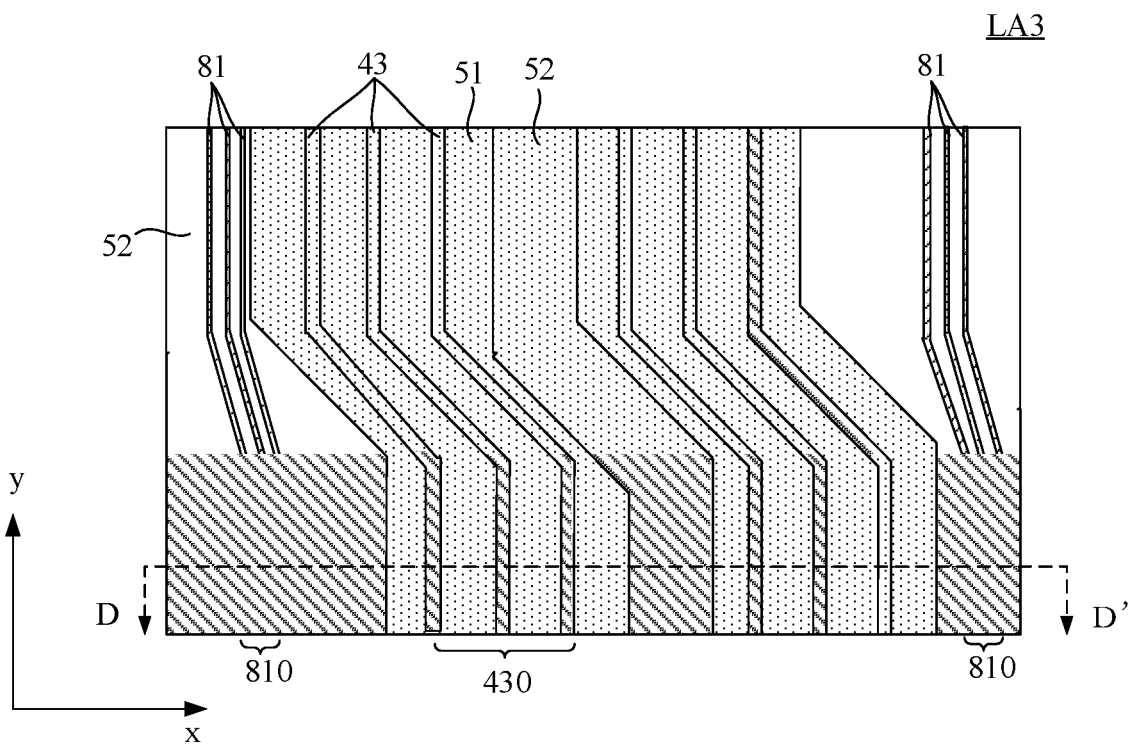
FIG. 6 is a top view of a third line arranging region of a display panel provided by an embodiment of the present disclosure.
Figure 7:
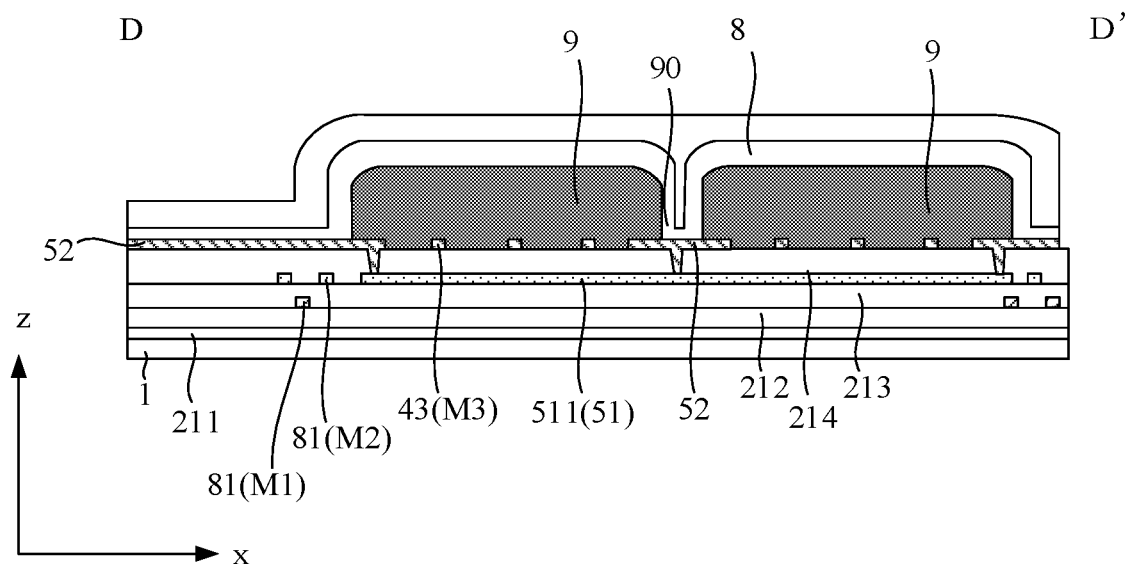
FIG. 7 is a cross-sectional view along DD' shown in FIG. 6.
Figure 8:
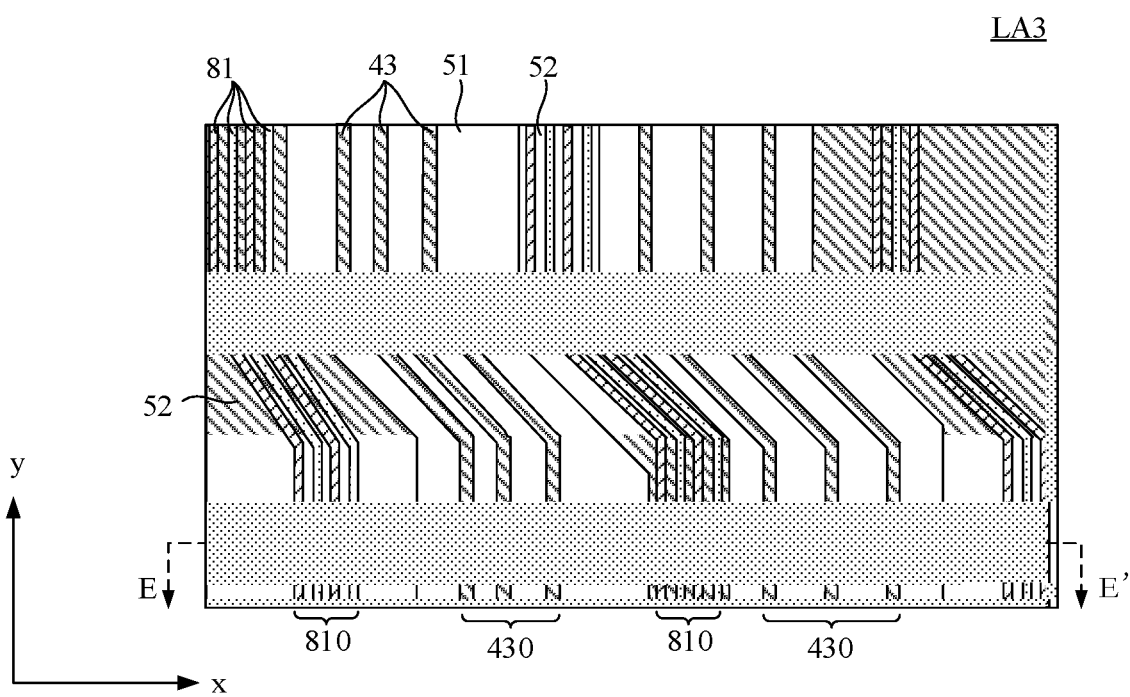
FIG. 8 is an enlarged top view of a third line arranging region of a display panel provided by another embodiment of the present disclosure.
Figure 9:
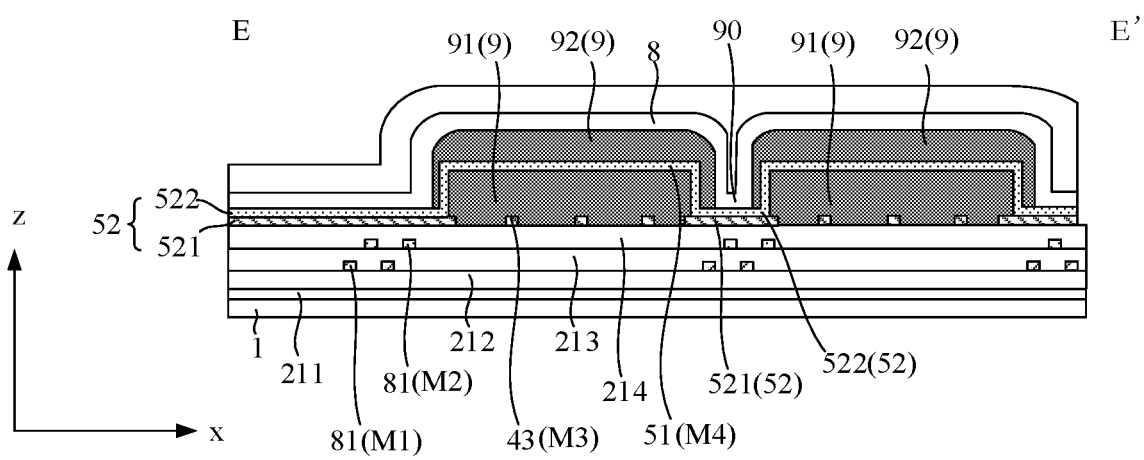
FIG. 9 is a cross-sectional view along EE' shown in FIG. 8.

FIG. 6 is a top view of a third line arranging region of a display panel provided by an embodiment of the present disclosure. FIG. 7 is a cross-sectional view along line DD' shown in FIG. 6. FIG. 8 is an enlarged top view of a third line arranging region of a display panel provided by another embodiment of the present disclosure. FIG. 9 is a cross-sectional view along EE' shown in FIG. 8. In an embodiment, as shown in FIG. 6, FIG. 7, FIG. 8, and FIG. 9, the power supply voltage line includes a first power supply voltage line 51 in the line arranging region LA3. The first power supply voltage line 51 refers to a power voltage line that at least partially overlaps with the third touch line 43 along the direction z perpendicular to the plane of the display panel. In an embodiment of the present disclosure, the first power supply voltage line 51 is also located in the display layer 2. The third touch line 43 and the first power supply voltage line 51 are arranged in different layers. The layers arranged in different layers are sequentially formed in a manufacturing process of the display panel, rather than being formed synchronously.

In the structure shown in FIG. 6 and FIG. 7, the first power supply voltage line 51 is located on a side of the third touch line 43 facing the substrate 1.

In the structures shown in FIG. 8 and FIG. 9, the first power supply voltage line 51 is located on a side of the third touch line 43 facing away from the substrate 1.

In the display panel provided by this embodiment of the present disclosure, the second touch line 42 and the third touch line 43 are both located in the display layer 2. For example, as shown in FIG. 3, the second touch line 42 and the third touch line 43 can be arranged in a same layer. With such configuration, the second touch line 42 and the third touch line 43 can be connected to each other without a via. If the second touch line 42 and the third touch line 43 are connected to each other through a via, in order to improve reliability of the connection between the second touch line 42 and the third touch line 43, the area of the via cannot be too small, that is, a space shall be provided in the line arranging region LA to achieve that the via can be arranged in this space. Therefore, with the configuration shown in FIG. 3, the second touch line 42 and the third touch line 43 can be connected to each other without a via, so that an area (also referred to as a surface area) of the line arranging region LA can be reduced.

As shown in FIG. 5, in an embodiment of the present disclosure, the second touch line 42 and the third touch line 43 can be respectively located in two conductive layers of the display layer 2. Compared with a solution in which one of the second touch line 42 and the third touch lines 43 is disposed in the display layer 2 and the other one is disposed in the touch layer 3, a distance between the two conductive layers of the display layer 2 is smaller than a distance between any one conductive layer of the display layer 2 and any one conductive layer of the touch layer 3, therefore, with the configuration shown in FIG. 5, when the second touch line 42 and the third touch line 43 are connected to each other through a via, a depth of the via can be smaller, so that the area occupied by the via can be reduced, thereby reducing the area of the line arranging region LA.

That is, with the configuration provided by this embodiment of the present disclosure, both the second touch line 42 and the third touch line 43 are provided in the display layer 2, thereby reducing the area of the line arranging region LA.

After arranging the second touch line 42 and the third touch line 43 in the display layer 2, in an embodiment of the present disclosure, the third touch line 43 and the first power supply voltage line 51 are disposed in different layers, which reduces a distance between the second touch line 42 and the third touch line 43 along the direction perpendicular to the plane of the display panel, and provides enough space for arranging the first power supply voltage line 51.

In an embodiment of the present disclosure, the third touch line 43 and the first power supply voltage line 51 at least partially overlap with each other in the direction perpendicular to the plane of the display panel. In this way, on the one hand, the third touch line 43 and the first power supply voltage line 51 can be arranged in a limited plane space in a plane of the display panel, which is beneficial to decrease of the area of the line arranging region LA. On the other hand, while achieving that the third touch line 43 and the first power supply voltage line 51 do not overlap with other traces or components, such configuration also allows the third touch line 43 and the first power supply voltage line 51 to have a relative large line width, which is beneficial to decrease of a resistance of the third touch line 43 and the first power supply voltage line 51, thereby reducing the attenuation during signal transmission, thereby improving the uniformity of the display effect and the touch effect.

When the display panel provided by this embodiment of the present disclosure adopts the self-capacitive touch technology, the self-capacitive touch panel includes a lot of touch electrodes and touch lines. Therefore, with the solution of this embodiment of the present disclosure, the line arranging region LA of the self-capacitive touch display panel has a relatively small area.

Exemplarily, when arranging the bonding pads in the binding region BA, various bonding pads including the touch bonding pads and the data bonding pads can be divided into a plurality of bonding pad rows arranged along the second direction y. As shown in FIG. 1, a plurality of bonding pad rows 60 is arranged along the second direction y, and each bonding pad row 60 includes multiple bonding pads arranged along a first direction x. The multiple bonding pads located in a same bonding pad row 60 include a touch bonding pad 6 and/or a display bonding pad. The first direction x and the second direction y intersect with each other. With such configuration, compared with the solution in which all the bonding pads in the binding region BA are arranged in one row along the first direction x, a length of the binding region BA in the first direction x can be reduced.

As can be seen from FIG. 3 and FIG. 5, the display panel provided by an embodiment of the present disclosure includes a buffer layer 8 covering the display layer 2. In an embodiment of the present disclosure, the third touch line is disposed in the display layer 2, so that the third touch line including the third touch line 431 and the third touch line 432 that are shown in FIG. 1 are not exposed at a surface layer of a to-be-bound display panel. With such configuration, even if there is a deviation in the binding process, the pins on the integrated chip 200 that should be connected to the touch bonding pads 600 are not connected to the third touch lines 431 or the third touch lines 432, thereby better achieving normal transmission of the signal.

In an embodiment of the present disclosure, the second line arranging region LA2 can be a bending region that can be bent. In an embodiment of the present disclosure, the second line arranging region LA2 is set as the bending region, so that the third line arranging region LA3 and the binding region BA can be bent to a backlight side of the display panel by means of the bending region, thereby increasing a screen-to-body ratio of the display panel.

In an embodiment, as shown in FIG. 3 and FIG. 5, only a bending metal layer W1 and an organic insulating layer are provided in the second line arranging region LA2, the second touch line 42 is located in the bending metal layer W1, and the bending metal layer W1 is located in the display layer 2. The organic insulating layer includes the first organic layer 91 and/or the second organic layer 92. No inorganic layer is provided in the second line arranging region LA2 to improve bendability of the second line arranging region LA2. The bending metal layer W1 is located in a neutral plane or close to the neutral plane. The neutral plane is a layer that receives the least stress during a bending process of each layer in the bending region. The neutral plane can be determined according to a thickness and modulus of each layer in the bending region.

In an embodiment, in addition to the first power supply voltage line, in the third line arranging region LA3, the power supply voltage line further includes a second power supply voltage line, as shown in FIG. 6, FIG. 7, FIG. 8 and FIG. 9, the second power voltage line 52 refers to a power voltage line that does not overlap with the third touch line 43 along the direction z perpendicular to the plane of the display panel.

The second power supply voltage line 52 is electrically connected to the first power supply voltage line 51. In this embodiment of the present disclosure, the second power supply voltage line 52 that is electrically connected to the first power supply voltage line 51 is provided, so that compared with a solution in which only the first power supply voltage line 51 is used as the power supply voltage line, an area of an orthographic projection of the power supply voltage line including the first power supply voltage line 51 and the second power supply voltage line 52 on the plane of the display panel can be increased, thereby being beneficial to decrease a resistance of the power supply voltage line and decrease the signal attenuation of the power supply voltage signal during transmission.

In an embodiment, when arranging the second power supply voltage line 52, as shown in FIG. 6, FIG. 7, FIG. 8, and FIG. 9, the third touch line 43 is arranged in a same layer as at least a part of the layer forming the second power supply voltage line 52. The two layers located in a same layer can be formed by a same patterning process in the manufacturing process of the display panel. Such configuration can simplify the process of the display panel.

As shown in FIG. 7, the third touch line 43 and the second power supply voltage line 52 are arranged in a same layer.

As shown in FIG. 9, the second power supply voltage line 52 includes at least two metal layers, and the third touch line 43 and one of the at least two metal layers are arranged in a same layer.

Exemplarily, as shown in FIG. 3, FIG. 6 and FIG. 7, when the second touch line 42 and the third touch line 43 are disposed in the third metal layer M3, the second power supply voltage line 52 in the third line arranging region LA3 is also located in the third metal layer M3. In an embodiment of the present disclosure, the first power supply voltage line 51 includes a first power supply voltage sub-line 511 located in the first metal layer M1 or the second metal layer M2. FIG. 7 is a schematic diagram illustrating that the first power supply voltage sub-line 511 is located in the second metal layer M2.

Figure 10:
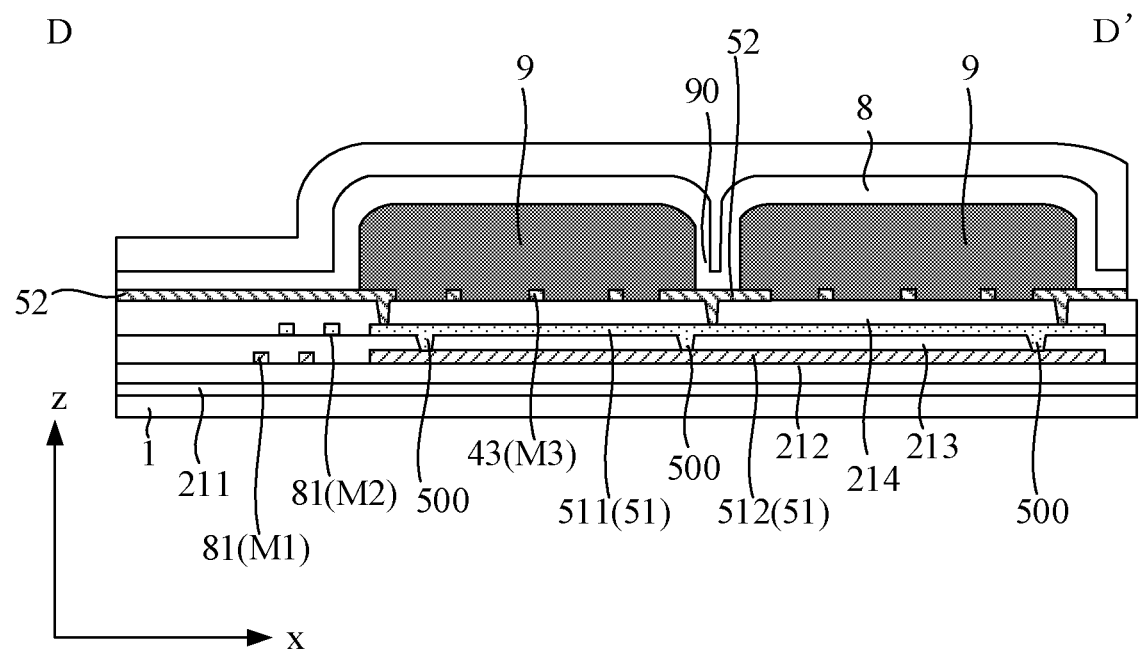
FIG. 10 is another cross-sectional view along DD' shown in FIG. 6.

FIG. 10 is another cross-sectional view along DD' shown in FIG. 6. In an embodiment, as shown in FIG. 10, the first power supply voltage line 51 includes a second power supply voltage sub-lines 512, and the second power supply voltage sub-lines 512 and the first power supply voltage sub-lines 511 are connected in parallel to reduce the resistance of the first power supply voltage line 51.

In an embodiment of the present disclosure, one of the first power supply voltage sub-line 511 and the second power supply voltage sub-line 512 is located in the first metal layer M1, and the other one of the first power supply voltage sub-line 511 and the second power supply voltage sub-line 512 is located in the second metal layer M2. As shown in FIG. 10, the first power supply voltage sub-line 511 is located in the second metal layer M2, and the second power supply voltage sub-line 512 is located in the first metal layer M1. The first power supply voltage sub-line 511 and the second power supply voltage sub-line 512 are electrically connected to each other by at least two vias 500 formed in the insulating layer between the first metal layer M1 and the second metal layer M2.

As shown in FIG. 6, FIG. 7, and FIG. 10, in the third line arranging region LA3, the third touch line 43 and the data line 81 at least partially overlap with each other in the first direction x. In the third line arranging region LA3, the data line 81 can be located in the first metal layer M1 or the second metal layer M2 of the display layer 2. Exemplarily, when there are multiple data lines 81, one of two adjacent data lines 81 can be located in the first metal layer M1, and the other one of the two adjacent data lines 81 can be located in the second metal layer M2, so as to increase a distance between two adjacent data lines 81 located in a same layer, thereby reducing the possibility of a short circuit between two adjacent data lines 81 arranged in a same layer.

In an embodiment, in the third line arranging region LA3, the third touch line 43 and the data line 81 do not overlap with each other in the direction z perpendicular to the plane of the display panel, thereby reducing a coupling interference between the third touch line 43 and the data line 81.

Exemplarily, as shown in FIG. 7 and FIG. 10, in the third line arranging region LA3, a distance is formed between the first power supply voltage line 51 and the data line 81 along a direction parallel to the plane of the display panel, and the first power supply voltage line 51 and the data line 81 do not overlap with each other in the direction z perpendicular to the plane of the display panel.

As shown in FIG. 7, in a case that the first power supply voltage line 51 includes the first power supply voltage sub-line 511 that is disposed in the second metal layer M2, a distance is formed between the first power supply voltage sub-line 511 and the data line 81 located in the second metal layer M2, and the first power supply voltage sub-line 511 and the data line 81 located in the second metal layer M2 are separated apart from each other by a fourth insulating layer 214 to achieve good insulation between the two.

As shown in FIG. 10, in a case that the first power supply voltage line 51 includes the first power supply voltage sub-line 511 disposed in the second metal layer M2 and the second power supply voltage sub-line 512 disposed in the first metal layer M1, a distance is formed between the first power supply voltage sub-line 511 and the data line 81 that is located in the second metal layer M2, and the first power supply voltage sub-line 511 and the data line 81 that is located in the second metal layer M2 are separated apart from each other by a fourth insulating layer 214, to achieve good insulation between the two; and a distance is formed between the second power supply voltage sub-line 512 and the data line 81 that is located in the first metal layer M1, and the second power supply voltage sub-line 512 and the data line 81 that is located in the first metal layer M1 are separated from each other by a third insulating layer 213, to achieve good insulation between the two.

In an embodiment of the present disclosure, in a case that the driving component layer 21 includes a fourth metal layer M4, as shown in FIG. 4, FIG. 5, FIG. 8, and FIG. 9, the second touch line 42 is located in the fourth metal layer M4, and the third touch line 43 is located in the third metal layer M3. The line arranging region LA can further include a second line-changing hole region KA2 where a second line-changing hole V2 is formed, and the second touch line 42 and the third touch line 43 are electrically connected to each other through a second line-changing hole V2. The second line-changing hole V2 is formed in the first organic layer 91 located between the second touch line 42 and the third touch line 43.

As shown in FIG. 9, the first power supply voltage line 51 is located in the fourth metal layer M4. The second power voltage line 52 includes a first power voltage sub-line 521 and a second power voltage sub-line 522 that are stacked in the direction z perpendicular to the plane of the display panel, the first power voltage sub-line 521 is located in the third metal layer M3, and the second power supply voltage sub-line 522 is located in the fourth metal layer M4. With such configuration, a thickness of the second power supply voltage line 52 can be increased, thereby reducing a resistance of the second power supply voltage line 52, and thus reducing the attenuation of the power supply voltage signal during the transmission process.

As shown in FIG. 9, along the direction parallel to the plane of the display panel, a distance is formed between the first power supply voltage sub-line 521 and the third touch line 43, and the first power supply voltage sub-line 521 and the third touch line 43 are separated apart from each other by a first organic layer 91 to achieve good insulation between the two.

As shown in FIG. 8 and FIG. 9, in the third line arranging region LA3, the data line 81 and the third touch line 43 do not overlap with each other in the direction z perpendicular to the plane of the display panel, so as to weaken coupling between the data line 81 and the third touch line 43.

Figure 11:
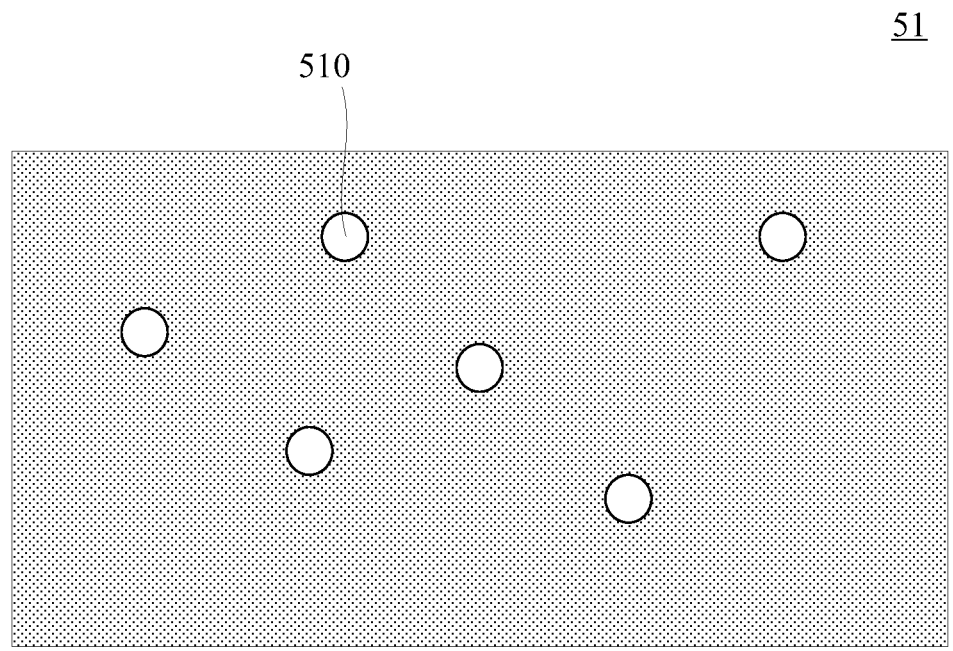
FIG. 11 is a top view of a first power supply voltage line located of a third line arranging region in a display panel according to an embodiment of the present disclosure.

FIG. 11 is a top view of a first power supply voltage line located of a third line arranging region in a display panel according to an embodiment of the present disclosure. In an embodiment, as shown in FIG. 11, when the first power supply voltage line 51 is arranged on a side of the third touch line 43 facing away from the substrate 1, the first power supply voltage line 51 includes a via 510. The via 510 can provide a flowing path for gas released from the first organic layer 91 located on the side of the first power supply voltage line 51 facing the substrate 1, so as to prevent the gas released from the first organic layer 91 from being concentrated between the first power supply voltage line 51 and the first organic layer 91, thereby avoiding a bulge formed at the first power supply voltage line 51.

Figure 12:
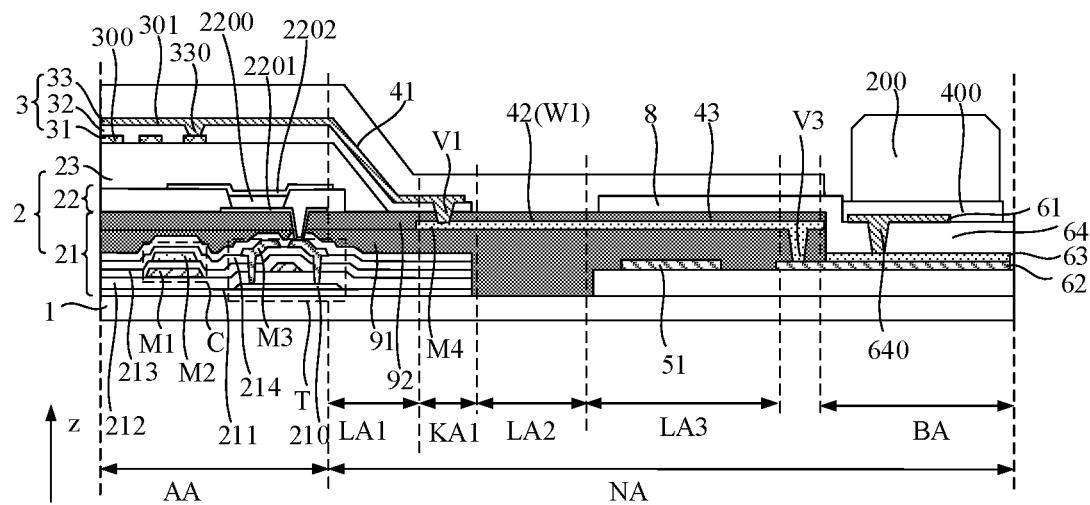
FIG. 12 is a cross-sectional view of a touch line of a display panel provided by an embodiment of the present disclosure.
Figure 13:
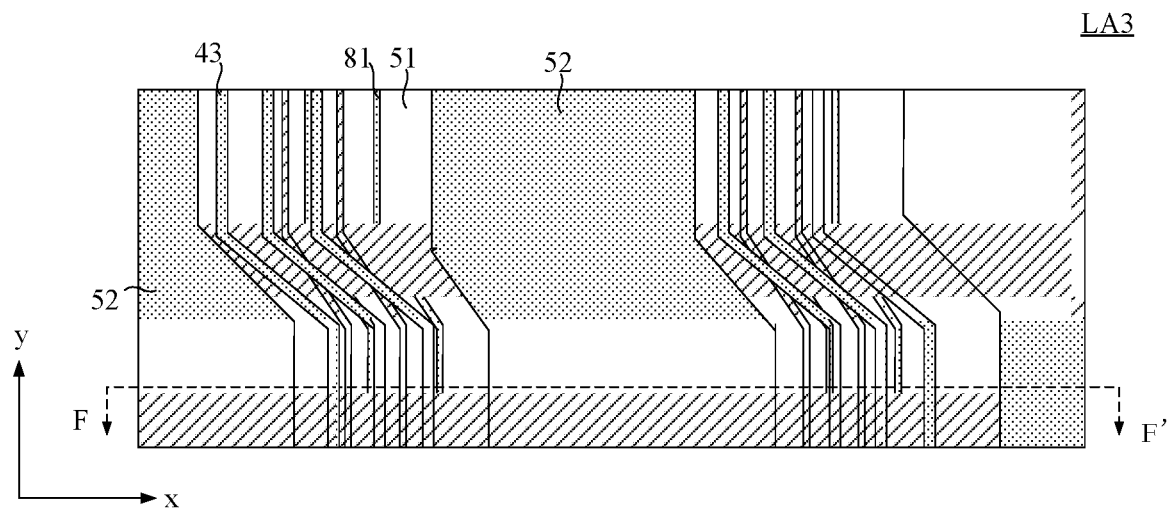
FIG. 13 is an enlarged top view of a third line arranging region of a display panel provided by another embodiment of the present disclosure.
Figure 14:
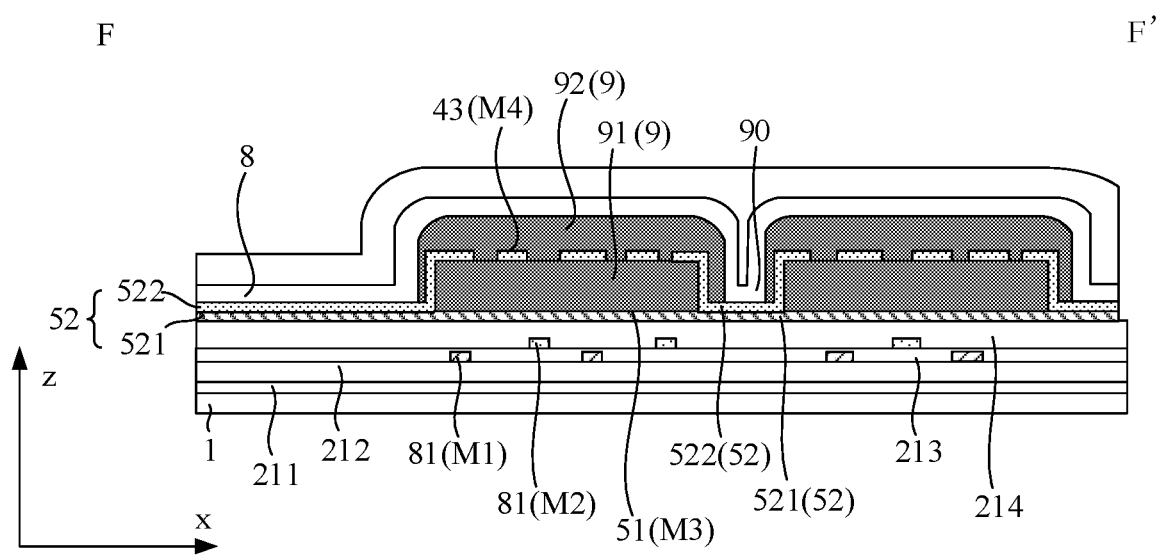
FIG. 14 is a cross-sectional view along FF' shown in FIG. 13.

FIG. 12 is a cross-sectional view of a touch line of a display panel provided by an embodiment of the present disclosure. FIG. 13 is a cross-sectional view of a display panel provided by another embodiment of the present disclosure. FIG. 14 is another top view of a third line arranging region. In an embodiment of the present disclosure, as shown in FIG. 12, FIG. 13, and FIG. 14, when the driving component layer 21 includes the fourth metal layer M4, the second touch line 42 and the third touch line 43 can be located in the fourth metal layer M4. As shown in FIG. 13 and FIG. 14, the first power supply voltage line 51 is located in the third metal layer M3.

The second power supply voltage line 52 includes the first power voltage sub-line 521 and the second power voltage sub-line 522 that are stacked in the direction z perpendicular to the plane of the display panel, the first power voltage sub-line 521 is located in the third metal layer M3, and the second power supply voltage sub-line 522 is located in the fourth metal layer M4. Such an arrangement of the two metal layers can increase the thickness of the second power supply voltage line 52, thereby reducing a resistance of the second power supply voltage line 52, and thus reducing the signal attenuation during the transmission of the power voltage signal.

As shown in FIG. 14, a distance is formed between the second power supply voltage sub-line 522 and the third touch line 43 along the direction parallel to the plane of the display panel, and the second power supply voltage sub-line 522 and the third touch line 43 are separated from each other by a second organic layer 92 to achieve good insulation between the two.

Exemplarily, as shown in FIG. 13 and FIG. 14, in the third line arranging region LA3, the data line 81 and the third touch line 43 at least partially overlap with each other in the direction z perpendicular to the plane of the display panel. In an embodiment of the present disclosure, in the third line arranging region LA3, the first power supply voltage line 51 can be disposed between the data line 81 and the third touch line 43. The first power supply voltage line 51 transmits a fixed signal. Therefore, with the first power supply voltage line 51, signal interference between the third touch line 43 and the data line 81 can be shielded.

In the third line arranging region LA3, the third touch line 43 and the data line 81 overlap with each other, which is beneficial to decrease of a plane area occupied by the third touch line 43 and the data line 81. In other words, in a limited plane area, such configuration can allow the cross-sectional area of the third touch line 43 and/or the data line 81 to be larger, which is beneficial to decrease a resistance of the third touch line 43 and/or the data line 81.

As shown in FIG. 7, FIG. 9, FIG. 10, and FIG. 14, an organic layer 9 is provided in the line arranging region L.

As shown in FIG. 7 and FIG. 10, the organic layer 9 is located at a side of the third touch line 43 facing away from the first power supply voltage line 51.

As shown in FIG. 9 and FIG. 14, the organic layer 9 includes a first organic layer 91 and a second organic layer 92. The first organic layer 91 is located between the third touch line 43 and the first power supply voltage wire 51. In FIG. 9, the second organic layer 92 is located on a side of the first power supply voltage line 51 facing away from the third touch line 43. In FIG. 14, the second organic layer 92 is located on a side of the third touch line 43 facing away from the first power supply voltage line 51.

Compared with inorganic materials, an organic material can have a larger thickness. Moreover, an organic material usually has a smaller dielectric constant. In this embodiment of the present disclosure, with the organic layer 9, coupling capacitance between the third touch line 43 and other line can be reduced.

As shown in FIG. 7, FIG. 9, FIG. 10, and FIG. 14, the organic layer 9 includes a hollow portion 90 overlapping with the second power supply voltage line 52 along the direction z perpendicular to the plane of the display panel. When forming the organic layer 9, after the second power supply voltage line 52 is formed, an organic material layer is firstly formed as a whole layer. Then, at a position corresponding to the second power supply voltage line 52, at least a part of the organic material layer is etched to form the hollow portion 90, that is, the organic material layer is patterned to obtain the patterned organic layer 9. Compared with a configuration where an organic layer is formed as a whole layer structure, such configuration in this embodiment of the present disclosure can reduce an area of the organic layer 9, which in turn can reduce an amount of gas released from the organic layer in the subsequent manufacturing process, thereby reducing the possibility of forming a bulge at a layer of the display panel.

In this embodiment of the present disclosure, the hollow portion 90 is provided at the position corresponding to the second power supply voltage line 52, and the organic layer 9 remains at a position corresponding to the first power supply voltage line 51, so as to achieve a good insulation between the first power supply voltage line 51 and the third touch line 43 and to weaken signal coupling between the first power supply voltage line 51 and the third touch line 43.

That the third touch line 43 and the second power supply voltage sub-line 522 are provided in a same layer in this embodiment of the present disclosure, indicates that the third touch line 43 and the second power supply voltage sub-line 522 are formed by a same process. A distance between the third touch line 43 and the substrate 1 can be different from a distance between the second power supply voltage sub-line 522 and the substrate 1. As shown in FIG. 14, a first organic layer 91 is provided between the third touch line 43 and the first power supply voltage line 51, and the first organic layer 91 is removed at the position of the second power supply voltage line 52 to form the hollow portion 90. That is, the distance between the third touch line 43 and the substrate 1 is greater than the distance between the second power supply voltage sub-line 522 and the substrate 1, but the third touch line 43 and the second power supply voltage sub-line 522 are still arranged in a same layer, that is, during formation, the organic layer including the hollow portion 90 is formed first, and then the third touch line 43 and the second power voltage sub-line 522 are formed simultaneously at different positions in a same process.

Exemplarily, as shown in FIG. 9, FIG. 10 and FIG. 14, the display panel further includes a buffer layer 8, and the buffer layer 8 is at least partially located in the hollow portion 90.

As shown in FIG. 6, multiple data line bunches 810 and multiple third touch line bunches 430 are provided in the third line arranging region LA3, the data line bunch 810 includes multiple data lines 81, and the third touch line bunch 430 includes multiple third touch lines 43. A distance between two adjacent data line bunches 810 is greater than or equal to a distance between two adjacent data lines 81 in a same data line bunch 810; and a distance between two adjacent third touch line bunches 430 is greater than or equal to a distance between two adjacent third touch lines 43 in a same third touch line bunch 430.

An orthographic projection of at least part of the second power supply voltage line 52 on the plane of the display panel is located between orthographic projections of two adjacent third touch line bunches 430 on the plane of the display panel. In this embodiment of the present disclosure, the third touch lines 43 are divided into bunches. As shown in FIG. 7, a hollow portion 90 can be provided in the organic layer 9. The hollow portion 90 can reduce an area of the organic layer 9 and reduce an amount of gas released from the organic layer 9 in the subsequent manufacturing process.

Figure 15:
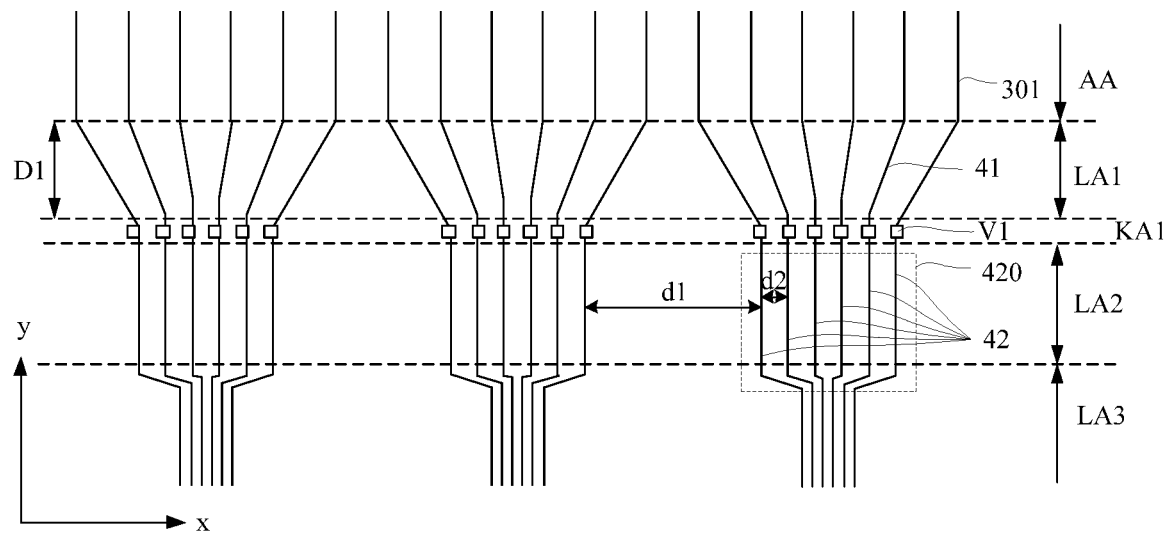
FIG. 15 is a top view of a display panel provided by another embodiment of the present disclosure.

FIG. 15 is a top view of a display panel provided by another embodiment of the present disclosure. Exemplarily, as shown in FIG. 15, when designing the first touch line 41 in the first line arranging region LA1, generally, a length of the binding region (not shown in FIG. 15) provided with various bonding pads along the first direction x is smaller than a length of the display region AA along the first direction x. In the binding region, a distance between two touch bonding pads adjacent to each other in the first direction x is also smaller than a distance between two touch signal lines adjacent to each other in the first direction in the display region AA. Based on such configuration, in an embodiment of the present disclosure, at least one first touch line includes an oblique line segment X1 as shown in FIG. 2. An orthographic projection of the oblique line segment X1 on the plane of the display panel extends in a direction intersecting with both the first direction x and the second direction y. The first line arranging region LA1 where multiple first touch lines are located presents an approximate sector shape having a wide top and a narrow bottom as shown in FIG. 15.

As shown in FIG. 2, FIG. 3, FIG. 4, FIG. 5, and FIG. 12, in an embodiment of the present disclosure, the line arranging region LA further includes a first line-changing hole region KA1 located between the first line arranging region LA1 and the second line arranging region LA2. A first line-changing hole V1 is provided in the first line-changing hole region KA1. The first touch line 41 and the second touch line 42 are connected to each other through the first line-changing hole V1. An extension line of the first touch line 41 and an extension line of the second touch line 42 intersect with each other at the first line-changing hole V1.

When multiple first line-changing holes V1 corresponding to multiple touch lines 4 are provided and the second line arranging region LA2 is a bending region, for example, as shown in FIG. 15, the line-changing hole V1 is adjacent to the second line arranging region LA2. In this embodiment of the present disclosure, the spacing between the lines in the second line arranging region LA2 is relatively large, so that each line in the second line arranging region LA2 has great bendability. Based on this, in this embodiment of the present disclosure, the first line-changing hole V1 is adjacent to the second line arranging region LA2, so that it can take full advantage of the large line spacing in the second line arranging region LA2, and there is no need to add additional space for arranging the plurality of first line-changing holes V1 while ensuring a minimum contact area of the metal located in the first line-changing hole V1, which is beneficial to make full use of the space in the line arranging region LA.

Exemplarily, as shown in FIG. 15, when arranging multiple second touch lines 42 located in the second line arranging region LA2, the multiple second touch lines 42 may be divided into multiple second touch line bunches 420. The second touch line bunch 420 includes multiple second touch lines 42, and a distance d1 between two adjacent second touch line bunches 420 is greater than or equal to a distance between two adjacent second touch lines 42 in a same second touch line bunch 420. FIG. 15 shows three second touch line bunches 420 arranged in the second line arranging region LA2 as an example.

In this embodiment of the present disclosure, the second touch lines 42 are arranged in bunches. Since the second touch lines 42 are connected to the first line-changing hole V1, it is equivalent to that multiple first line-changing holes V1 are arranged in groups. That is, it is equivalent to that multiple first touch lines 41 are arranged in bunches. One bunch of first touch lines 41 is connected to one second touch line bunch 420 through one group of first line-changing holes V1.

Figure 16:
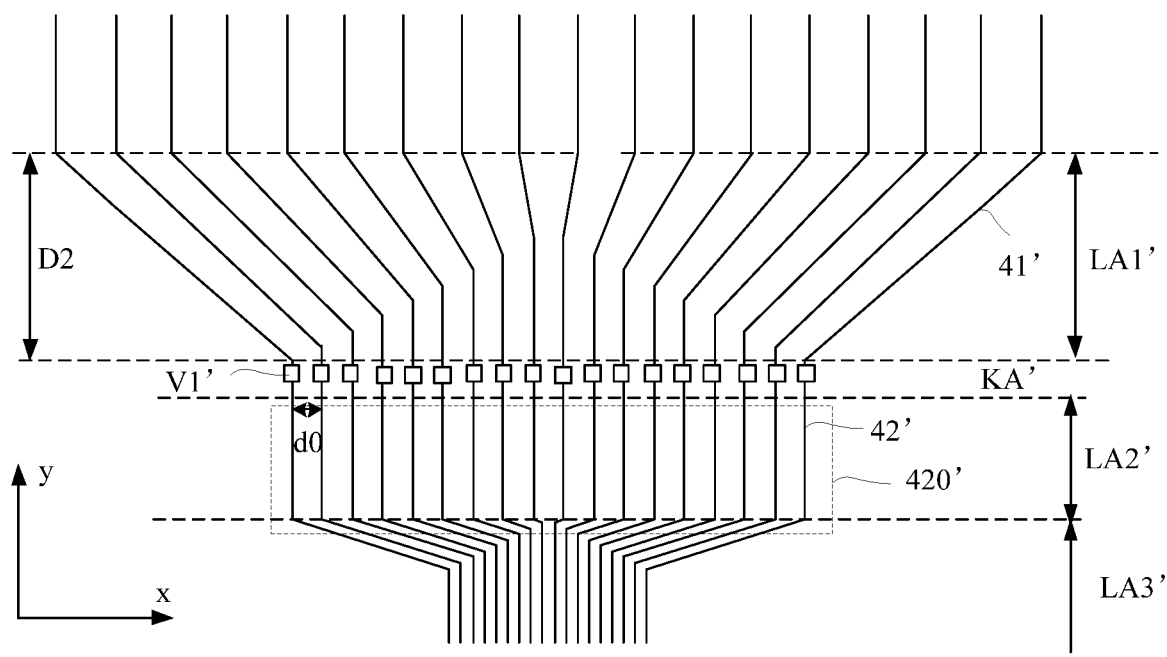
FIG. 16 is a top view of a display panel in the related art.

In a solution in the related art, multiple second touch lines 42 are collectively arranged in only one bunch, as shown in FIG. 16, which is a top view of a display panel in the related art, all the second touch lines 42' in the display panel are collectively arranged, and the first line-changing holes V1' adjacent to the second line arranging region LA2' are also collectively arranged, that is, only one second touch line bunch 420' is provided in the second line arranging region LA2'. Only one first line-changing hole group is provided in the first line-changing hole region KA'. In this way, in the first line arranging region LA1', a lot of first touch lines 41' will inevitably have a large distance from the second touch line bunch 420' along the first direction x. As shown in FIG. 16, when a center of the second touch line bunch 420' corresponds to a center of the first line arranging region LA1', taking the orientation shown in FIG. 16 as an example, the multiple first touch lines 41' located at left and right sides of the first line arranging region LA1' have oblique line segments X1' having a relatively large inclination angle. Each line has a width, in order to achieve good insulation between the lines, and taking the process error into account, the spacing between the lines cannot be compressed infinitely. Therefore, more first touch lines 41' being arranged obliquely will cause a larger length of the first line arranging region LA1' in the second direction y.

In this embodiment of the present disclosure, multiple second touch lines 42 located in the second line arranging region LA2 are divided into at least two bunches. Comparing FIG. 15 and FIG. 16, it can be seen that based on the structure shown in FIG. 15, the second touch line bunches 420 can be arranged in a scattered manner, and each second touch line bunch 420 can be arranged as close as possible to the first touch line 41 at the corresponding position. In this way, compared with the embodiment of FIG. 16 where all the first touch lines in the first line arranging region LA1 are collectively pulled to one position, the configuration shown in FIG. 15 allows the number of the first touch lines 41 connected to each second touch line bunch 420 to be reduced. Therefore, while ensuring the width of the line and the minimum spacing between the lines, a length of the first line arranging region LA1 in the second direction y can be reduced. Comparing FIG. 15 and FIG. 16, it can be seen that the length D1 of the first line arranging region LA1 in the second direction y in FIG. 15 and the length D2 of the first line arranging region LA1' in the second direction y in FIG. 16 satisfy D1<D2.

Figure 17:
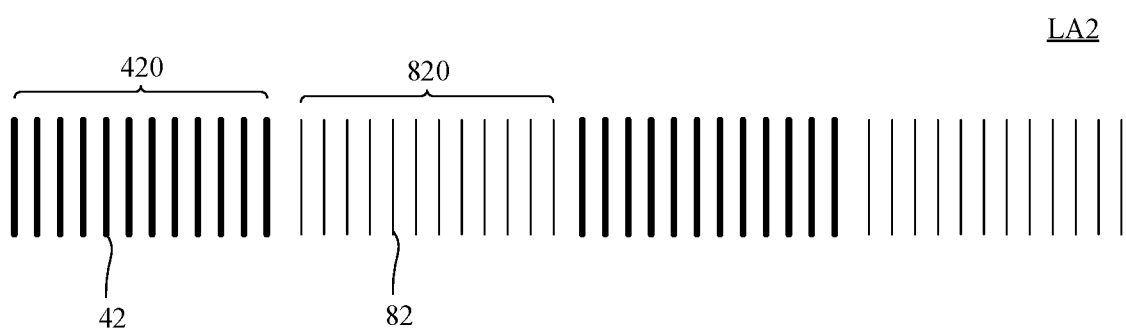
FIG. 17 is a schematic diagram of a second line arranging region of a display panel provided by an embodiment of the present disclosure.

As mentioned above, when the second line arranging region LA2 is set as a bendable bending region, in the second line arranging region, the data line and the second touch line are arranged in a same layer and are located in a neutral plane or close to the neutral plane. FIG. 17 is a schematic diagram of a second line arranging region of a display panel provided by an embodiment of the present disclosure. Exemplarily, as shown in FIG. 17, in the second line arranging region LA2, the data lines include multiple data line bunches 820. The data line bunch 820 includes multiple data lines 82, and a distance between two adjacent data line bunches 820 is greater than or equal to a distance between two adjacent data lines 82 in a same data line bunch 820.

In an embodiment of the present disclosure, the data line bunches 820 and the second touch line bunches 420 can be alternately arranged.

As shown in FIG. 17, in the second line arranging region LA2, the data line bunches 820 and the second touch line bunches 420 are alternately arranged in the first direction x, so as to make reasonable use of the length space of the second line arranging region LA2 in the first direction x.

The width of the data line 82 and the width of the second touch line 42 in the second line arranging region LA2 are not limited in the embodiments of the present disclosure. The different widths of line segments shown in FIG. 17 are exemplarily illustrated to clearly distinguishing the data line 82 from the second touch line 42, and do not represent the actual widths of the data line 82 and the second touch line 42.

Figure 18:
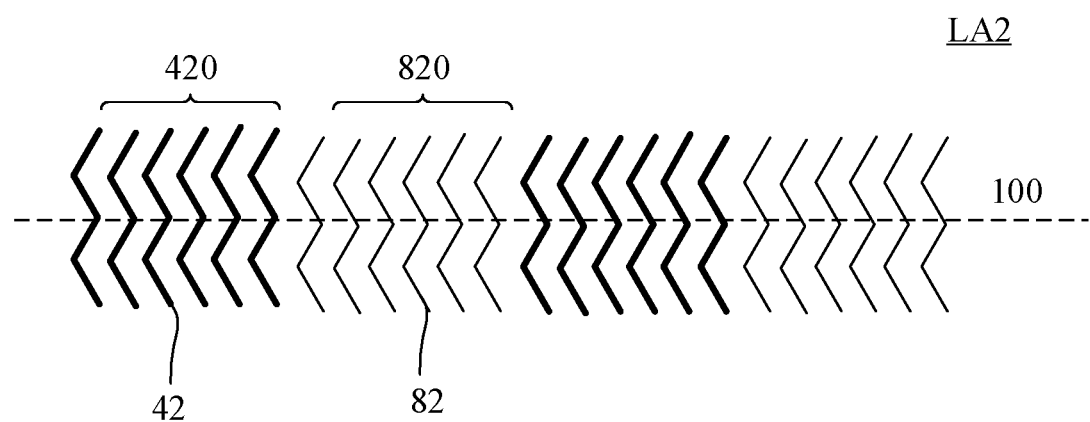
FIG. 18 is a schematic diagram of a second line arranging region of a display panel provided by another embodiment of the present disclosure.

FIG. 18 is a schematic diagram of a second line arranging region of a display panel provided by another embodiment of the present disclosure. Exemplarily, as shown in FIG. 18, when the second line arranging region LA2 is set as a bending region, the bending region has a bending axis 100, in the second line arranging region LA, each of the second touch line 42 and the data line 82 forms an angle with the bending axis 100, and this angle is a non-right angle (i.e., an angle different from a right angle). Such configuration can reduce the stress applied on the second touch line 42 and the data line 82 in the bent state compared with a solution in which the second touch line 42 or the data line 82 is arranged perpendicular to the bending axis 100, thereby reducing the probability that the second touch line 42 and the data line 82 break in the bending region, and thus improving reliability of the display panel.

FIG. 18 exemplarily illustrates the shapes of the second touch line 42 and the data line 82. Other solutions where a non-right angle is formed between the bending axis and each of the second touch line 42 and the data line 82 are included in the embodiments of the present disclosure.

In an embodiment, when designing the third touch line and the data line that are located in the third line arranging region LA3, an arrangement of the third touch line and the data line can correspond to an arrangement of the pins in the integrated chip 200. For example, when the display pins and touch pins are arranged in bunches in the integrated chip 200, the data lines and the third touch lines in the third line arranging region LA3 can also be arranged in bunches; and when the display pins and the touch pins are not arranged in bunches, the data lines and the third touch lines can also be not arranged in bunches.

In an embodiment, as shown in FIG. 3, FIG. 5, and FIG. 12, the touch bonding pad 6 includes a first conductive layer 61 and a second conductive layer 62. The first conductive layer 61 is located in the touch layer 3, and the second conductive layer 62 is located in the display layer 2 and electrically connected to the third touch line 43.

In an embodiment of the present disclosure, the third line arranging region LA3 and the binding region BA are adjacent to each other.

Exemplarily, as shown in FIG. 3 and FIG. 5, the second conductive layer 62 and the third touch line 43 can be in a same layer, that is, the second conductive layer 62 and the third touch line 43 are directly connected to each other without through a line-changing hole.

In an embodiment, as shown in FIG. 12, the second conductive layer 62 and the third touch line 43 can be arranged in different layers, and the second conductive layer 62 and the third touch line 43 are electrically connected to each other through a third line-changing hole V3.

As shown in FIG. 3, FIG. 5, and FIG. 12, the arrangement of the first conductive layer 61 can make the touch bonding pad 6 form a convex structure with respect to an area adjacent to the touch bonding pad 6, which is beneficial to bind the touch bonding pad 6 and the subsequent integrated chip 200 through an anisotropic conductive adhesive 400.

As shown in FIG. 3, FIG. 5 and FIG. 12, an inorganic insulating layer 64 is provided between the first conductive layer 61 and the second conductive layer 62 and includes a via 640 through which the first conductive layer 61 and the second conductive layer 62 are electrically connected to each other. In an embodiment of the present disclosure, the number of vias 640 can be one or more. This embodiment of the present disclosure avoids arranging an organic layer in the binding region BA, so that in the subsequent high-temperature pressing process, the stability of the layer in the binding region BA can be achieved, and deformation can be avoided.

Exemplarily, as shown in FIG. 5 and FIG. 12, the touch bonding pad 6 further includes a third conductive layer 63 located between the first conductive layer 61 and the second conductive layer 62 and electrically connected to both the first conductive layer 61 and the second conductive layer 62. The arrangement of the third conductive layer 63 can reduce a resistance of the touch bonding pad 6. Exemplarily, the third conductive layer 63 can be provided in the same layer as an existing layer in the display region AA.

Figure 19:
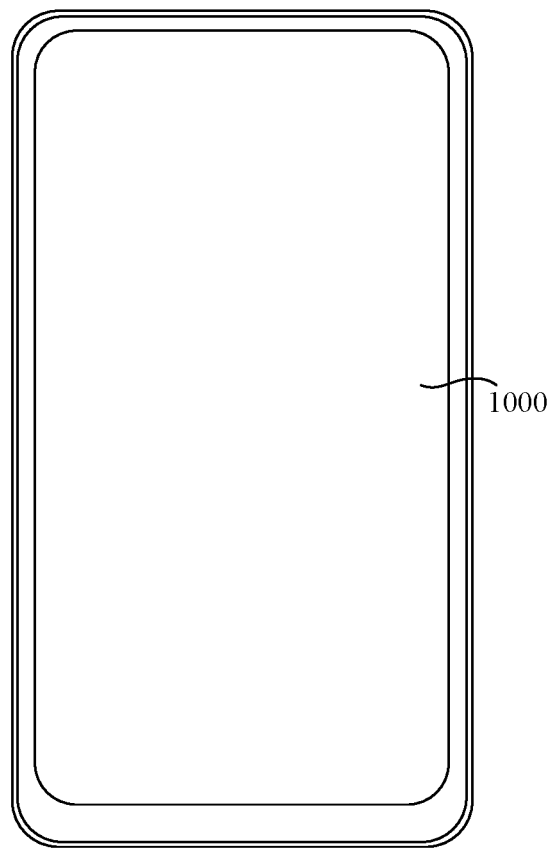
FIG. 19 is a schematic diagram of a display device provided by an embodiment of the present disclosure.

An embodiment of the present disclosure further provides a display device. FIG. 19 is a schematic diagram of a display device provided by an embodiment of the present disclosure. In an embodiment, as shown in FIG. 19, the display device includes the display panel 1000. A specific structure of the display panel 1000 has been described in detail in the above embodiments, and will not be repeated herein. The display device shown in FIG. 19 is only for schematic illustration, and the display device may be any electronic device with a display function, such as a mobile phone, a tablet computer, a notebook computer, an electronic paper book, or a television.

In the display device provided by this embodiment of the present disclosure, the area of the line arranging region can be reduced by arranging both the second touch line and the third touch line in the display layer.

After arranging the second touch line and the third touch line in the display layer, this embodiment of the present disclosure arranges the third touch line and the first power supply voltage line in different layers, which ensures an arrangement space of the first power supply voltage line while reducing a distance between the second touch line and the third touch line along the direction perpendicular to the plane of the display panel.

In an embodiment of the present disclosure, the third touch line and the first power supply voltage line at least partially overlap with each other in the direction perpendicular to the plane of the display panel. In this way, on the one hand, the third touch line and the first power supply voltage line can be arranged in a limited plane space in a plane of the display panel, which is beneficial to decrease of the area of the line arranging region; and on the other hand, while achieving that the third touch line and the first power supply voltage line do not overlap with other traces or components, such configuration also allows the third touch line and the first power supply voltage line to have a relative large line width, which is beneficial to decrease of a resistance of the third touch line and the first power supply voltage line, thereby reducing the attenuation during signal transmission, thereby improving the uniformity of the display effect and the touch effect.

When the display panel provided by the embodiment of the present disclosure adopts the self-capacitive touch technology, the self-capacitive touch panel includes a lot of touch electrodes and a lot of touch lines. Therefore, with the solution of the embodiments of the present disclosure, it can achieve that the line arranging region of the self-capacitive touch display panel has a small area.

The above are merely some embodiments of the present disclosure, which is not intended to limit the present disclosure. Within the principles of the present disclosure, any modification, equivalent replacement, and improvement shall fall into the protection scope of the present disclosure.

What is claimed is:

1. A display panel having a display region and a non-display region, the non-display region comprising a line arranging region and a binding region, the display panel comprising:
   touch electrodes located in the display region and in a touch layer;
   pixel units located in the display region and in a display layer;
   power supply voltage signal lines located in the display region;
   touch lines located in the line arranging region;
   power supply voltage lines located in the line arranging region and electrically connected to the power supply voltage signal lines; and
   touch bonding pads located in the binding region and electrically connected to the touch electrodes through the touch lines,
   wherein the touch layer is located on a side of the display layer facing away from a substrate, the line arranging region comprises a first line arranging region, a second line arranging region and a third line arranging region, the second line arranging region is located between the first line arranging region and the third line arranging region, and the first line arranging region is located at a side of the second line arranging region close to the display region;
   wherein the touch lines comprise a first touch line located in the first line arranging region, at least one second touch line located in the second line arranging region, and at least one third touch line located in the third line arranging region, wherein the first touch line is located in the touch layer, and the at least one second touch line and the at least one third touch line are located in the display layer; and
   wherein the power supply voltage lines comprise at least one first power supply voltage line, wherein the at least one third touch line is disposed in a layer different from a layer where the at least one first power supply voltage line is disposed, and one of the at least one third touch line at least partially overlaps with one of the at least one first power supply voltage line along a direction perpendicular to a plane of the display panel, and an orthographic projection of the one of the at least one first power supply voltage line onto the plane of the display panel totally covers an orthographic projection of the one of the at least one third touch line onto the plane of the display panel.

2. The display panel according to claim 1, wherein the second line arranging region is a bending region; only a bending metal layer and an organic insulating layer are located in the second line arranging region, and an inorganic insulating layer is not located in the second line arranging region; the at least one second touch line is located in the bending metal layer; and the bending metal layer is located in the display layer.

3. The display panel according to claim 1, wherein one of the touch bonding pads comprises a first conductive layer located in the touch layer, and a second conductive layer located in the display layer and electrically connected to the at least one third touch line, wherein an inorganic insulating layer is provided between the first conductive layer and the second conductive layer and comprises a via, through which the first conductive layer and the second conductive layer are electrically connected to each other.

4. The display panel according to claim 1, wherein the display layer comprises a driving component layer, wherein the driving component layer comprises a first metal layer, a second metal layer, and a third metal layer that are located on a same side of the substrate, the second metal layer is located between the first metal layer and the third metal layer, and the third metal layer is located on a side of the second metal layer facing away from the substrate.

5. The display panel according to claim 4, further comprising:
   data voltage signal lines located in the display region;
   data lines located in the line arranging region; and
   data bonding pads located in the binding region and electrically connected to the data voltage signal lines through the data lines,
   wherein in the second line arranging region, the data lines and the at least one second touch line are located in a same layer, and the data lines do not overlap with the at least one second touch line in the direction perpendicular to the plane of the display panel.

6. The display panel according to claim 5, wherein the at least one second touch line comprises a plurality of second touch lines, data line bunches and second touch line bunches are provided in the second line arranging region, wherein each bunch of the data line bunches comprises at least two data lines of the data lines, and each bunch of the second touch line bunches comprises at least two second touch lines of the plurality of second touch lines;
   wherein a distance between two adjacent data line bunches of the data line bunches is greater than or equal to a distance between two adjacent data lines of the at least two data lines in one of the data line bunches, and a distance between two adjacent second touch line bunches of the second touch line bunches is greater than or equal to a distance between two adjacent second touch lines of the at least two second touch lines in one of the second touch line bunches; and wherein the data line bunches and the second touch line bunches are alternately arranged in the second line arranging region.

7. The display panel according to claim 4, wherein the at least one second touch line and the at least one third touch line are located in the third metal layer.

8. The display panel according to claim 7, wherein one of the at least one first power supply voltage line comprises a first power supply voltage sub-line located in the first metal layer or the second metal layer.

9. The display panel according to claim 8, wherein the one of the at least one first power supply voltage line further comprises a second power supply voltage sub-line, wherein the second power supply voltage sub-line and the first power supply voltage sub-line are connected in parallel; and one of the first power supply voltage sub-line and the second power supply sub-line is located in the first metal layer, and the other one of the first power supply voltage sub-line and the second power supply sub-line is located in the second metal layer.

10. The display panel according to claim 8, further comprising:
data voltage signal lines located in the display region;
data lines located in the line arranging region; and
data bonding pads located in the binding region and electrically connected to the data voltage signal lines through the data lines,
wherein in the third line arranging region, at least one of the at least one third touch line and the at least one first power supply voltage line does not overlap with the data lines.

11. The display panel according to claim 10, wherein the at least one third touch line comprises a plurality of third touch lines, data line bunches and third touch line bunches are located in the third line arranging region, each bunch of the data line bunches comprises at least two data lines of the data lines, and each bunch of the third touch line bunches comprises at least two third touch lines of the plurality of third touch lines;
wherein a distance between two adjacent data line bunches of the data line bunches is greater than or equal to a distance between two adjacent data lines of the at least two data lines in one of the data line bunches, and a distance between two adjacent third touch line bunches of the third touch line bunches is greater than or equal to a distance between two adjacent third touch lines of the at least two third touch lines in one of the third touch line bunches; and
wherein an orthographic projection of one of the at least one first power supply voltage line on the plane of the display panel is located between orthographic projections of two adjacent third touch line bunches of the third touch line bunches on the plane of the display panel.

12. The display panel according to claim 8, further comprising:
an organic layer located in the line arranging region and disposed on a side of one of the at least one third touch line facing away from one of the at least one first power supply voltage line.

13. The display panel according to claim 12, wherein the organic layer comprises a hollow portion, wherein the hollow portion does not overlap with the at least one second power supply voltage line along the direction perpendicular to the plane of the display panel.

14. The display panel according to claim 4, wherein in the third line arranging region, the power supply voltage lines further comprise at least one second power supply voltage line electrically connected to the at least one first power supply voltage line; and the at least one third touch line and at least a part of the at least one second power supply voltage line are arranged in a same layer.

15. The display panel according to claim 14, wherein the driving component layer further comprises a fourth metal layer located on a side of the third metal layer facing away from the substrate; and
wherein the at least one second touch line is located in the fourth metal layer, and the at least one third touch line is located in the fourth metal layer or the third metal layer.

16. The display panel according to claim 15, wherein the at least one third touch line is located in the fourth metal layer;
wherein one of the at least one second power supply voltage line comprises a first power supply voltage sub-line and a second power supply voltage sub-line that are stacked in the direction perpendicular to the plane of the display panel, wherein the first power supply voltage sub-line is located in the third metal layer, the second power supply voltage sub-line is located in the fourth metal layer, and the second power supply voltage sub-line does not overlap with one of the at least one third touch line along the direction perpendicular to the plane of the display panel; and
wherein the first power supply voltage line is located in the third metal layer.

17. The display panel according to claim 16, further comprising:
data voltage signal lines located in the display region;
data lines located in the line arranging region; and
data bonding pads located in the binding region and electrically connected to the data voltage signal lines through the data lines,
wherein in the third line arranging region, one of the data lines at least partially overlaps with one of the at least one third touch line in the direction perpendicular to the plane of the display panel.

18. The display panel according to claim 15, wherein the at least one third touch line is located in the third metal layer;
wherein one of the at least one second power supply voltage line comprises a first power supply voltage sub-line and a second power supply voltage sub-line that are stacked in the direction perpendicular to the plane of the display panel, wherein the first power supply voltage sub-line is located in the third metal layer, the second power supply voltage sub-line is located in the fourth metal layer, and the first power supply voltage sub-line does not overlap with one of the at least one third touch line along the direction perpendicular to the plane of the display panel; and
wherein the first power supply voltage line is located in the fourth metal layer.

19. The display panel according to claim 18, further comprising:
data voltage signal lines located in the display region;
data lines located in the line arranging region; and
data bonding pads located in the binding region and electrically connected to the data voltage signal lines through the data lines, wherein in the third line arranging region, the data lines do not overlap with the at least one third touch line in the direction perpendicular to the plane of the display panel.

20. A display device comprising a display panel, the display panel having a display region and a non-display region, the non-display region comprising a line arranging region and a binding region, and the display panel comprising:
- touch electrodes located in the display region and in a touch layer;
- pixel units located in the display region and in a display layer;
- power supply voltage signal lines located in the display region;
- touch lines located in the line arranging region;
- power supply voltage lines located in the line arranging region and electrically connected to the power supply voltage signal lines; and
- touch bonding pads located in the binding region and electrically connected to the touch electrodes through the touch lines,
- wherein the touch layer is located on a side of the display layer facing away from a substrate, the line arranging region comprises a first line arranging region, a second line arranging region and a third line arranging region, the second line arranging region is located between the first line arranging region and the third line arranging region, and the first line arranging region is located at a side of the second line arranging region close to the display region;
- wherein the touch lines comprise a first touch line located in the first line arranging region, at least one second touch line located in the second line arranging region, and at least one third touch line located in the third line arranging region, wherein the first touch line is located in the touch layer, and the at least one second touch line and the at least one third touch line are located in the display layer; and
- wherein the power supply voltage lines comprise at least one first power supply voltage line, wherein the at least one third touch line is disposed in a layer different from a layer where the at least one first power supply voltage line is disposed, and one of the at least one third touch line at least partially overlaps with one of the at least one first power supply voltage line along a direction perpendicular to a plane of the display panel, and an orthographic projection of the one of the at least one first power supply voltage line onto the plane of the display panel totally covers an orthographic projection of the one of the at least one third touch line onto the plane of the display panel.

* * * * *